(12) United States Patent
Hisatomi et al.

(10) Patent No.: US 11,201,034 B2
(45) Date of Patent: *Dec. 14, 2021

(54) PLASMA PROCESSING APPARATUS AND CONTROL METHOD

(71) Applicant: TOKYO ELECTRON LIMITED, Tokyo (JP)

(72) Inventors: Ryuji Hisatomi, Miyagi (JP); Chishio Koshimizu, Miyagi (JP); Michishige Saito, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 16/728,203

(22) Filed: Dec. 27, 2019

(65) Prior Publication Data

US 2020/0211823 A1 Jul. 2, 2020

(30) Foreign Application Priority Data

Dec. 28, 2018 (JP) .............................. JP2018-248260
Dec. 12, 2019 (JP) .............................. JP2019-224853

(51) Int. Cl.
*H01J 37/32* (2006.01)
*H01L 21/683* (2006.01)
*H01L 21/67* (2006.01)

(52) U.S. Cl.
CPC ............... *H01J 37/32146* (2013.01); *H01J 37/32009* (2013.01); *H01J 37/32183* (2013.01); *H01J 37/32724* (2013.01); *H01J 37/32467* (2013.01); *H01J 37/32633* (2013.01); *H01J 37/32642* (2013.01); *H01J 37/32651* (2013.01); *H01J 2237/002* (2013.01); *H01J 2237/334* (2013.01);
(Continued)

(58) Field of Classification Search
None
See application file for complete search history.

(56) References Cited

U.S. PATENT DOCUMENTS 8,852,385 B2 * 10/2014 Koshiishi .......... H01J 37/32027
156/345.28
9,431,310 B2 * 8/2016 Kuboi ............... H01J 37/32926
(Continued)

FOREIGN PATENT DOCUMENTS

JP 2006-286813 A 10/2006

*Primary Examiner* — Amy Cohen Johnson
*Assistant Examiner* — Srinivas Sathiraju
(74) *Attorney, Agent, or Firm* — Rothwell, Figg, Ernst & Manbeck, P.C.

(57) ABSTRACT

A plasma processing apparatus includes: a processing container; an electrode that places a substrate thereon within the processing container; a plasma generation source that supplies plasma into the processing container; a bias power supply that supplies bias power to the electrode; a part exposed to the plasma in the processing container; a DC power supply that supplies a DC voltage to the part; a controller that executes a process including a first control procedure in which a first state in which the DC voltage has a first voltage value and a second state in which the DC voltage has a second voltage value higher than the first voltage value are periodically repeated, and the first voltage value is applied in a partial period in each cycle of a potential of the electrode, and the second voltage value is applied such that the first state and the second state are continuous.

20 Claims, 18 Drawing Sheets

(52) U.S. Cl.
 CPC .... *H01L 21/67069* (2013.01); *H01L 21/6833* (2013.01)

(56) References Cited

U.S. PATENT DOCUMENTS

| | | | |
|---|---|---|---|
| 9,859,126 B2* | 1/2018 | Kihara | H01L 21/02164 |
| 9,892,888 B2* | 2/2018 | Baek | C23C 16/4404 |
| 10,224,228 B2* | 3/2019 | Kim | H01L 21/6833 |
| 10,504,697 B2* | 12/2019 | Baek | C23C 16/4401 |
| 10,665,434 B2* | 5/2020 | Matsumoto | H01R 39/381 |
| 10,763,083 B2* | 9/2020 | Yang | H01J 37/32155 |
| 2015/0170886 A1* | 6/2015 | Morimoto | H01L 21/3065 156/345.24 |
| 2016/0013063 A1* | 1/2016 | Ranjan | H01L 21/32136 438/714 |
| 2016/0020073 A1* | 1/2016 | Chae | H01L 21/02101 216/67 |
| 2016/0203958 A1* | 7/2016 | Arase | H01J 37/32935 438/10 |
| 2017/0271190 A1* | 9/2017 | Kim | H01L 21/67103 |
| 2017/0278730 A1* | 9/2017 | Dou | H01L 21/68742 |
| 2018/0047547 A1* | 2/2018 | Matsumoto | H01J 37/32715 |
| 2018/0358209 A1* | 12/2018 | Lee | H01J 37/321 |
| 2019/0189493 A1* | 6/2019 | Ogawa | H01J 37/32458 |
| 2020/0211823 A1* | 7/2020 | Hisatomi | H01J 37/32146 |

* cited by examiner

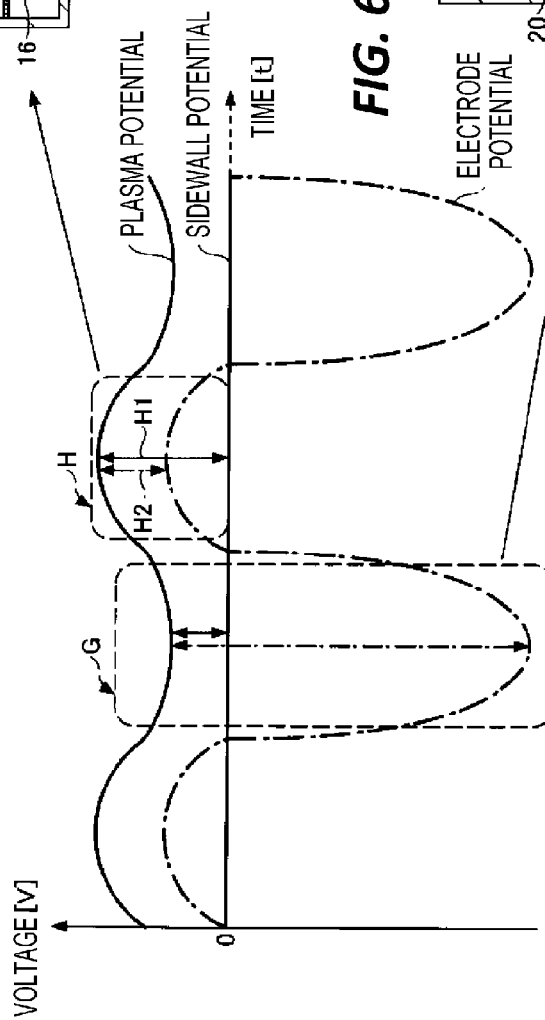

PLASMA PROCESSING APPARATUS AND CONTROL METHOD

CROSS-REFERENCE TO RELATED APPLICATIONS

This application is based on and claims priority from Japanese Patent Application Nos. 2018-248260 and 2019-224853, filed on Dec. 28, 2018 and Dec. 12, 2019, respectively, with the Japan Patent Office, the disclosures of which are incorporated herein in their entireties by reference.

TECHNICAL FIELD

The present disclosure relates to a plasma processing apparatus and a temperature control method.

BACKGROUND

Japanese Patent Laid-Open Publication No. 2006-286813 proposes to provide a plasma processing apparatus that is capable of easily ensuring uniformity of plasma regardless of the state of the plasma.

SUMMARY

According to an aspect of the present disclosure, there is provided a plasma processing apparatus including: a processing container; an electrode configured to place a substrate thereon within the processing container; a plasma generation source configured to supply plasma into the processing container; a bias power supply configured to supply bias power of a desired waveform to the electrode; a part exposed to the plasma in the processing container; a power supply configured to supply a voltage of a desired waveform to the part; a storage medium having a program including a first control procedure in which a first state in which the voltage has a first voltage value and a second state in which the voltage has a second voltage value higher than the first voltage value are periodically repeated, the first voltage value is applied in a partial period in each cycle of a potential of the electrode, and the second voltage value is applied such that the first state and the second state are continuous; and a controller configured to execute the program of the storage medium.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 6A to 6C are views illustrating an example of positive and negative electrode potentials and collision energy of ions according to an embodiment.

DESCRIPTION OF EMBODIMENT

Figure 1A:
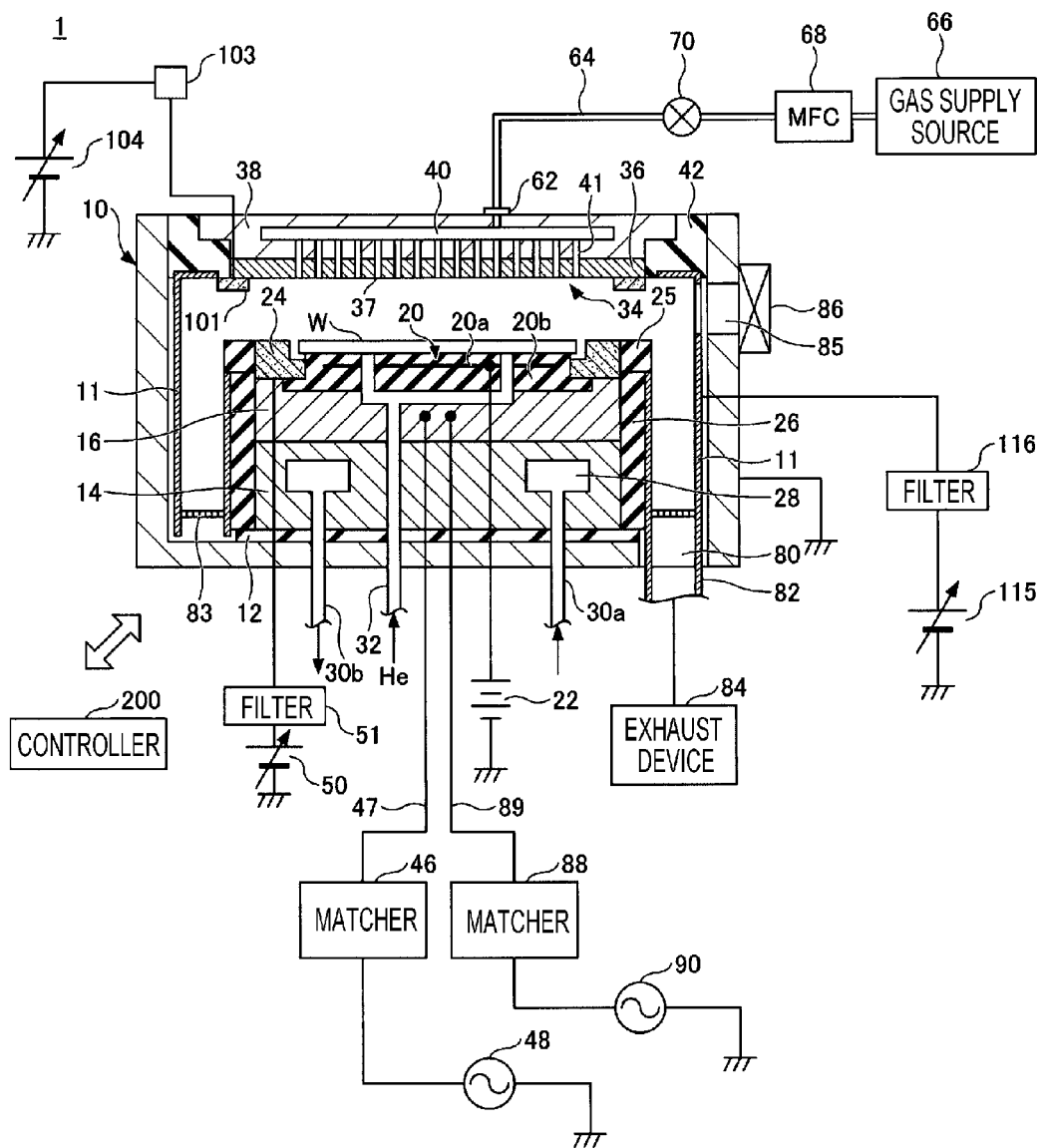
FIG. 1A is a view illustrating an exemplary plasma processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

[Introduction]

In a plasma processing apparatus, when the potential of an electrode that applies radio-frequency power exceeds the potential of a wall of a processing container or a part in the processing container, a phenomenon occurs in which the wall or the part is sputtered, which affects a process result. In addition, in a plasma processing for a wafer W, a by-product generated during the plasma processing adheres to the sidewall or the ceiling wall of the processing container. In this case, a cleaning process for removing by-products is necessary, which results in reduction in productivity.

Therefore, in the related art, for an electrode in processing containers, an attempt has been made to make the collision energy of ions per unit area to the wall of the processing container appear low. In addition, in order to suppress the wall from being sputtered, an attempt has been made to change the thickness of a sprayed coating on the sidewall of the processing container or to change the material used for coating the sidewall to a material having a stronger binding force. Furthermore, an attempt has been made to adjust the setting of, for example, a cleaning time or supply power of a recipe representing the procedure of waferless dry cleaning (WLDC) depending on the conditions in the processing container.

In a plasma processing apparatus according to an embodiment to be described below, an arbitrary DC voltage is applied to a part which is exposed to plasma in a processing container and to which a by-product adheres, following a change in electrode potential which applies radio-frequency power. Thus, the collision energy of ions to the above-mentioned part is controlled so as to achieve the reduction of sputtering to the part. In addition, an efficient cleaning process is realized. The part, which is exposed to the plasma in the processing container and to which the by-product adheres is constituted by a part within the processing container. The part may be at least one of parts within the processing container, such as the ceiling wall, the insulator ring, a deposition shield, and the baffle plate. Alternatively, the part may be at least one of dedicated parts disposed outside a processing space or gas space formed under an upper electrode facing the electrode or a space above an edge ring. However, when there is an effect of suppressing wall sputtering, the part may be a part that is exposed to the plasma in the processing container and has no by-product attached thereto. Hereinafter, as an example of the parts under the influence of plasma, a plasma processing apparatus will be described by taking a deposition shield as an example.

Hereinafter, a radio-frequency as the source power is also referred to as HF, and source power is also referred to as HF power. In addition, a radio-frequency as a bias power having a frequency lower than the frequency of the source power is also referred to as LF, and the bias power is also referred to as LF power.

[Overall Configuration of Substrate Processing Apparatus]

FIG. 1A is a view illustrating an exemplary plasma processing apparatus 1 according to an embodiment. The plasma processing apparatus 1 according to the present embodiment is a capacitively coupled parallel plate plasma processing apparatus, and includes, for example, a cylindrical processing container 10 made of aluminum having an anodized surface or sprayed yttrium oxide ($Y_2O_3$). The processing container 10 is grounded.

A cylindrical support base 14 is disposed on the bottom portion of the processing container 10 via an insulating plate 12 made of, for example, ceramics, and a stage 16 made of, for example, aluminum is provided on the support base 14. The stage 16 constitutes a lower electrode, and a wafer W, which is an example of an object to be processed, is placed thereon.

On the upper surface of the stage 16, an electrostatic chuck 20 configured to hold the wafer W by an electrostatic force is provided. The electrostatic chuck 20 has a structure in which an electrode 20a made of a conductive film is sandwiched between insulating layers 20b, and a DC power supply 22 is connected to the electrode 20a. Then, the wafer W is attracted to and held on the electrostatic chuck 20 by an electrostatic force such as, for example, a Coulomb force generated by a DC voltage from the DC power supply 22.

On the stage 16 and at the peripheral edge of the wafer W, a conductive edge ring 24 including, for example, silicon is disposed. A cylindrical inner wall member 26 including, for example, quartz is provided on the outer peripheral side surfaces of the stage 16 and the support base 14. An insulator ring 25 is provided on the outer peripheral side surface of the edge ring 24.

Inside the support base 14, a coolant chamber 28 is provided, for example, on the circumference. A coolant having a predetermined temperature, for example, cooling water, is circulated and supplied from a chiller unit provided outside to the coolant chamber 28 via pipes 30a and 30b, and the processing temperature of the wafer W on the stage 16 is controlled by the temperature of the coolant. In addition, a heat transfer gas (e.g., He gas) from a heat transfer gas supply mechanism is supplied between the upper surface of the electrostatic chuck 20 and the rear surface of the wafer W via a gas supply line 32.

An upper electrode 34 is provided above the stage 16 so as to face the stage 16. A space between the upper electrode 34 and the lower electrode is a plasma processing space. The upper electrode 34 faces the wafer W on the stage 16 and forms a surface that is in contact with the plasma processing space, i.e. a facing surface.

The upper electrode 34 is supported in the upper portion of the processing container 10 via an insulative shielding member 42. The upper electrode 34 constitutes a surface facing the stage 16, and has an electrode plate 36 having a large number of gas ejection holes 37, and an electrode support 38 configured to detachably support the electrode plate 36 and including a conductive material (e.g., aluminum having an anodized surface). The electrode plate 36 may be made of silicon or SiC. A gas diffusion chamber 40 is provided inside the electrode support 38, and a large number of gas flow holes 41 communicating with the gas ejection holes 37 extend downward from the gas diffusion chamber 40.

The electrode support 38 has a gas inlet 62 formed to guide the processing gas to the gas diffusion chamber 40, a gas supply pipe 64 is connected to the gas inlet 62, and a processing gas supply source is supplied to the gas supply pipe 64. The gas supply pipe 64 includes a mass flow controller (MFC) 68 and an opening/closing valve 70 in this order from the upstream side. Then, a processing gas for etching reaches the gas diffusion chamber 40 from the processing gas supply source 66 through the gas supply pipe 64 and is ejected from the gas ejection holes 37 into the plasma processing space through the gas flow holes 41. Thus, the upper electrode 34 functions as a shower head for supplying the processing gas.

A variable DC power supply 50 is electrically connected to the edge ring 24, and a DC voltage is applied from the variable DC power supply 50. A controller 200 controls the polarities and current/voltage of the DC voltage and the DC current supplied from the variable DC power supply 50, and an electronic switch for turning on/off the DC voltage and the DC current. The variable DC power supply 50 is connected with a low-pass filter 51 configured to cut LF and HF currents and protect the variable DC power supply 50.

A variable DC power supply 115 is electrically connected to the deposition shield 11, and a DC voltage is applied to the deposition shield 11 from the variable DC power supply 115. A controller 200 controls the polarities of the DC voltage and the DC current supplied from the variable DC power supply 115, the DC voltage and the DC current, and an electronic switch for turning on/off the DC voltage and the DC current. The variable DC power supply 115 is connected with a low-pass filter 116 configured to cut LF and HF currents and protect the variable DC power supply 115. In the present embodiment, the variable DC power supply 115 is connected to the deposition shield 11, but is not limited thereto. The variable DC power supply 115 may be connected to at least one of the parts within the processing container 10, such as the ceiling wall, the insulator ring 25, and the baffle plate 83. Alternatively, the variable DC power supply 115 may be connected to at least one of dedicated parts disposed outside a processing space or gas space formed under an upper electrode facing the electrode or a space above an edge ring. In addition, the variable DC power supply 115 is not limited to one, and two or more variable DC power supplies 115 may be connected to at least one part of, for example, the deposition shield 11 and the ceiling wall. In an example illustrated in FIGS. 1A and 1B, a dedicated part 101 is disposed outside the upper portion of the edge ring 24. The part 101 has therein an electrode, which is electrically connected to a variable DC power supply 104. Thus, the electrode is applied with a DC voltage from the variable DC power supply 104. The DC power supply 104 is connected with a low-pass filter 103 configured to cut LF and HF currents and protect the variable DC power supply 104. The part 101 may have a ring shape, an arc shape, or any other shape. The part 101 is made of, for example, silicon (Si) or silicon carbide (SiC).

A first radio-frequency power supply 48 is connected to the stage 16 via a power feed rod 47 and a matcher 46. The first radio-frequency power supply 48 applies LF power to the stage 16. Thus, ions are drawn into the wafer W on the stage 16. The first radio-frequency power supply 48 outputs radio-frequency power having a frequency within a range of 200 kHz to 13.56 MHz. The matcher 46 matches the internal impedance of the first radio-frequency power supply 48 with a load impedance.

A second radio-frequency power supply 90 is connected to the stage 16 via a power feed rod 89 and a matcher 88. The second radio-frequency power supply 90 applies HF power to the stage 16. The frequency of HF may be 13.56 MHz or more, for example, 100 MHz. The frequency of LF is lower than the frequency of HF, and may be, for example, 400 kHz. The matcher 88 matches the internal impedance of the second radio-frequency power supply 90 with a load impedance. A filter configured to allow a predetermined radio-frequency to pass to the ground therethrough may be connected to the stage 16. Meanwhile, the HF power supplied from the second radio-frequency power supply 90 may be applied to the upper electrode 34.

An exhaust port 80 is provided in the bottom portion of the processing container 10, and an exhaust device 84 is connected to the exhaust port 80 via an exhaust pipe 82. The exhaust device 84 has a vacuum pump such as, for example, a turbo molecular pump, and is capable of decompressing the inside of the processing container 10 to a desired degree of vacuum. A wafer W carry-in/out port 85 is provided in the sidewall of the processing container 10, and the carry-in/out port 85 is configured to be opened and closed by a gate valve 86. A deposition shield 11 is detachably installed in order to prevent by-product (deposits) generated during etching from adhering along the inner wall of the processing container 10. That is, the deposition shield 11 constitutes the wall of the processing container. The deposition shield 11 is also installed on the outer periphery of the inner wall member 26. A baffle plate 83 is provided between the deposition shield 11 on the processing container wall side in the bottom portion of the processing container 10 and the deposition shield 11 on the inner wall member 26 side. As for the deposition shield 11 and the baffle plate 83, an aluminum material coated with ceramics such as, for example, $Y_2O_3$ may be used.

When performing an etching process in the plasma processing apparatus the above-described a configuration, first, the gate valve 86 is opened, a wafer W to be etched is carried into the processing container 10 via the carry-in/out port 85, and is then placed on the stage 16. Then, a processing gas for etching is supplied from the processing gas supply source 66 to the gas diffusion chamber 40 at a predetermined flow rate, and is supplied into the processing container 10 through the gas flow holes 41 and the gas ejection holes 37. In addition, the inside of the processing container 10 is exhausted by the exhaust device 84, and the pressure therein is set to a value, for example, within a range of 0.1 to 150 Pa. Here, various gases used in the related art may be employed as the processing gas. For example, a gas containing a halogen element represented by a fluorocarbon gas ($C_xF_y$) such as, for example, $C_4F_8$ gas may be used. Furthermore, other gases such as, for example, Ar gas and $O_2$ gas may be included.

The HF power is applied to the stage 16 from the second radio-frequency power supply 90 in the state in which the etching gas is introduced into the processing container 10 in this manner In addition, LF power is applied from the first radio-frequency power supply 48 to the stage 16. In addition, a DC voltage is applied from the DC power supply 22 to the electrode 20a so as to hold the wafer W on the stage 16. Furthermore, a DC voltage is applied from the variable DC power supply 50 to the edge ring 24.

The processing gas ejected from the gas ejection holes 37 of the upper electrode 34 is dissociated and ionized mainly by the HF power, thereby generating plasma. The surface to be processed of the wafer W is etched by radicals and ions in the plasma. In addition, by applying LF power to the stage 16, a plasma control margin may be widened. For example, etching of a hole having a high aspect ratio may be enabled by controlling ions in the plasma.

The plasma processing apparatus 1 is provided with a controller 200 configured to control the operations of the entire apparatus. The controller 200 performs a desired plasma processing such as etching according to a process recipe stored in a memory such as, for example, a read only memory (ROM) or random access memory (RAM). In the process recipe, process time, pressure (gas exhaust), radio-frequency power, voltage, and various gas flow rates, which are control information of the apparatus with respect to process conditions, may be set. In the process recipe, for example, temperatures inside the processing container (e.g., the temperature of the upper electrode, the temperature of the sidewall of the processing container, the temperature of the wafer W, and the temperature of the electrostatic chuck temperature) and the temperature of the coolant output from the chiller may be set. Meanwhile, process recipes representing these programs and processing conditions may be stored in a hard disk or semiconductor memory. In addition, the process recipe may be set at a predetermined position and read out in the state of being stored in a portable computer-readable storage medium such as, for example, a CD-ROM or a DVD.

For example, the controller 200 may perform a control such that a DC voltage is alternately turned on and off or changed in its magnitude by applying the DC voltage output from the variable DC power supply 115 in a partial period in each cycle of a voltage, a current, an electromagnetic field, a change in light emission cycle of a generated plasma, or a change in sheath thickness of plasma on the wafer W, measured in a bias power transmission path (the lower electrode) (hereinafter, also referred to as a "periodically varying parameter"). The controller 200 may perform a control such that a DC voltage is alternately turned on and off or changed in its magnitude by a signal synchronized with a cycle of a radio-frequency of the bias power or a period of a pulse wave (hereinafter, also referred to as a "DC pulse") of the bias power.

The bias power transmission path means the first radio-frequency power supply 48→the matcher 46→the power feed rod 47→the stage 16→plasma→the upper electrode 34→(ground). The voltage, current, and electromagnetic field measured in the bias power transmission path mean a voltage, a current, and an electromagnetic field measured in the part from the first radio-frequency power supply 48 to the parts from the first radio-frequency power supply 48 to the stage 16 through the inside of the matcher 46 and the power feed rod 47 The voltage, current, electromagnetic field to be measured, or an electromagnetic field measured in the plasma.

The DC voltage is controlled such that a first state and a second state, which will be described later, are periodically repeated, and that in the first state, a first voltage value is applied to a partial period within each cycle of the periodically varying parameter, and in the second state, a second voltage value is applied continuously with the first state. The DC voltage may be controlled such that the first state, the second state, and two or more states where the DC voltage has two or more voltage values are periodically repeated, the first voltage value is applied in a partial period in each cycle of a potential of the electrode, and the second voltage value and the two or more voltage values are sequentially applied such that the first state, the second state, and the two or more states are continuous. The "periodically varying parameter" is an example of the periodically varying electrode potential.

The periodically varying parameter may be any one of a voltage, a current, and an electromagnetic field measured in any one member from the stage 16 to the inside of the matcher connected via the power feed rod 47.

Figure 2:
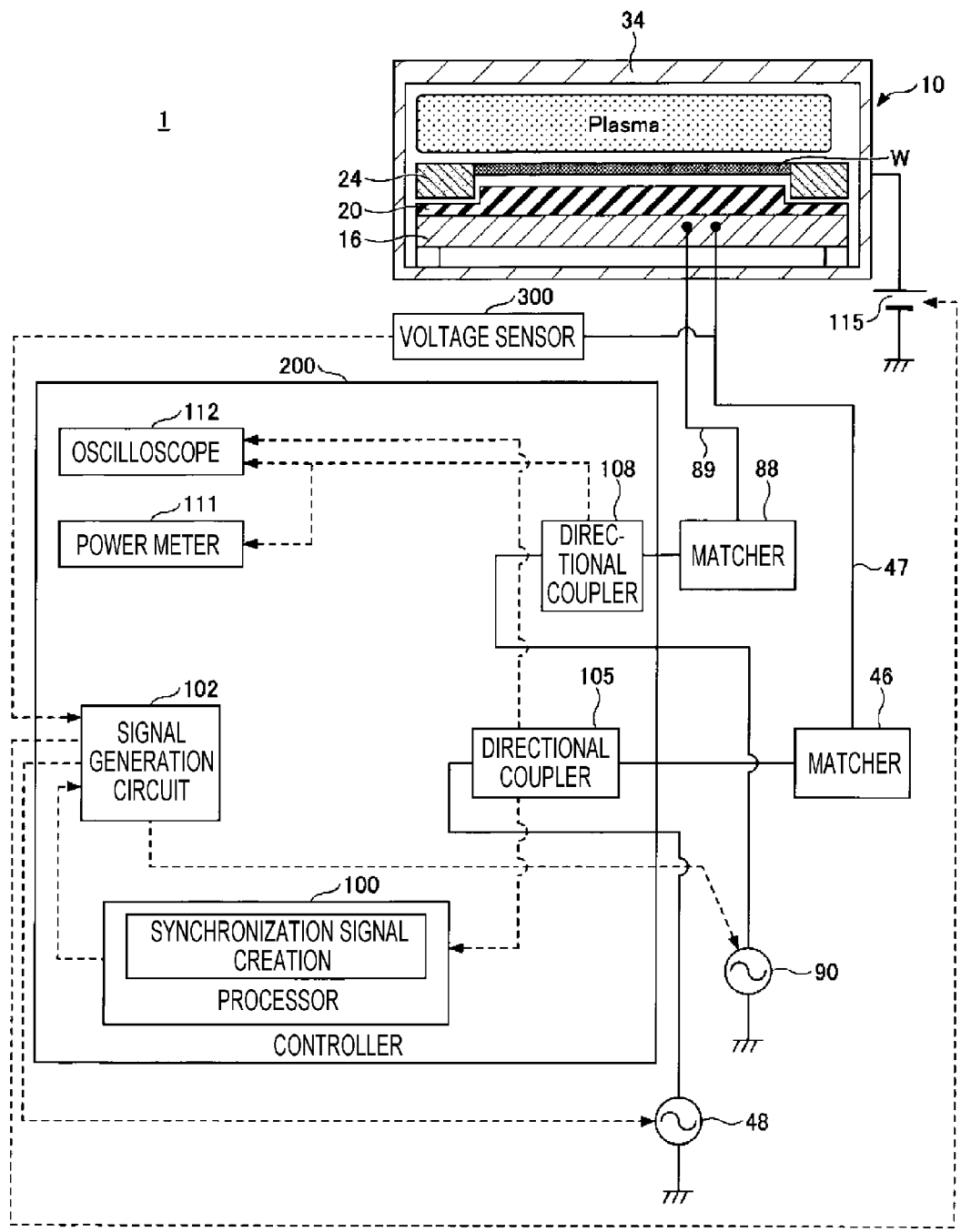
FIG. 2 is a view schematically illustrating an exemplary configuration of a controller according to an embodiment.

The method of measuring the periodically varying parameter in the bias power transmission path may be, for example, a method of measuring a voltage, a current, or an induced electromagnetic field of each part by installing a voltage sensor, a current sensor, or a BZ sensor (a sensor for measuring an induced magnetic field) in the vicinity of any one part of the bias power transmission path. Meanwhile, although FIG. 2 illustrates a voltage sensor 300, a current sensor or a BZ sensor may be adopted without being limited thereto. In addition, each of the sensors may be arranged so as to be connected to the power feed rod 47, but is not limited thereto. A signal from a sensor such as, for example, the voltage sensor 300 is input to, for example, the signal generation circuit 102 of the controller 200.

Furthermore, the light emission cycle of plasma and the cycle of a change in the sheath thickness of plasma on the wafer W may be used as indicators. The light emission cycle of the plasma may be detected using, for example, a photodiode, a photomicrosensor, or a photoelectric conversion element such as a photomultiplier. With respect to the sheath thickness, the change in sheath thickness may be measured by pushing a shutter at an interval of nanoseconds (e.g., 10 nsec to 250 nsec) using, for example, an ICCD camera. For example, the DC voltage output from the variable DC power supply 115 may be controlled to be synchronized with the cycle of the LF voltage. In this way, it is possible to control the collision energy of ions. In addition, it is possible to improve the efficiency of the cleaning process.

Meanwhile, the stage 16 is an example of an electrode (first electrode) on which the wafer W is placed. The upper electrode is an example of an electrode (second electrode) that faces the stage 16. The first radio-frequency power supply 48 is an example of a bias power supply that supplies LF power (bias power) to the stage 16. The second radio-frequency power supply 90 is an example of a source power supply that supplies source power having a frequency higher than the LF power to the stage 16 or the upper electrode 34. The variable DC power supply 115 is an example of a power supply that supplies a DC voltage to a part exposed to plasma in the processing container 10. The variable DC power supply 115 may be a DC power supply. The controller 200 is an example of a controller that controls the bias power supply, the source power supply, and the DC power supply. The potential of the lower electrode (the stage 16) to which the bias power is applied is also referred to as an electrode potential.

Meanwhile, in the plasma processing apparatus 1 illustrated in FIG. 1A, the variable DC power supply 115 is electrically connected to the deposition shield 11, and a DC voltage is applied from the variable DC power supply 115. However, the present disclosure is not limited thereto. The variable DC power supply 115 may be connected to at least one of parts within the processing container 10, for example, the ceiling wall of the processing container 10, the insulator ring 25, and the baffle plate 83 and a DC voltage may be applied to at least one of the parts. Further, the variable DC power supply 115 may be connected to a dedicated part disposed outside a processing space or gas space formed under an upper electrode facing the electrode or a space above an edge ring.

Figure 1B:
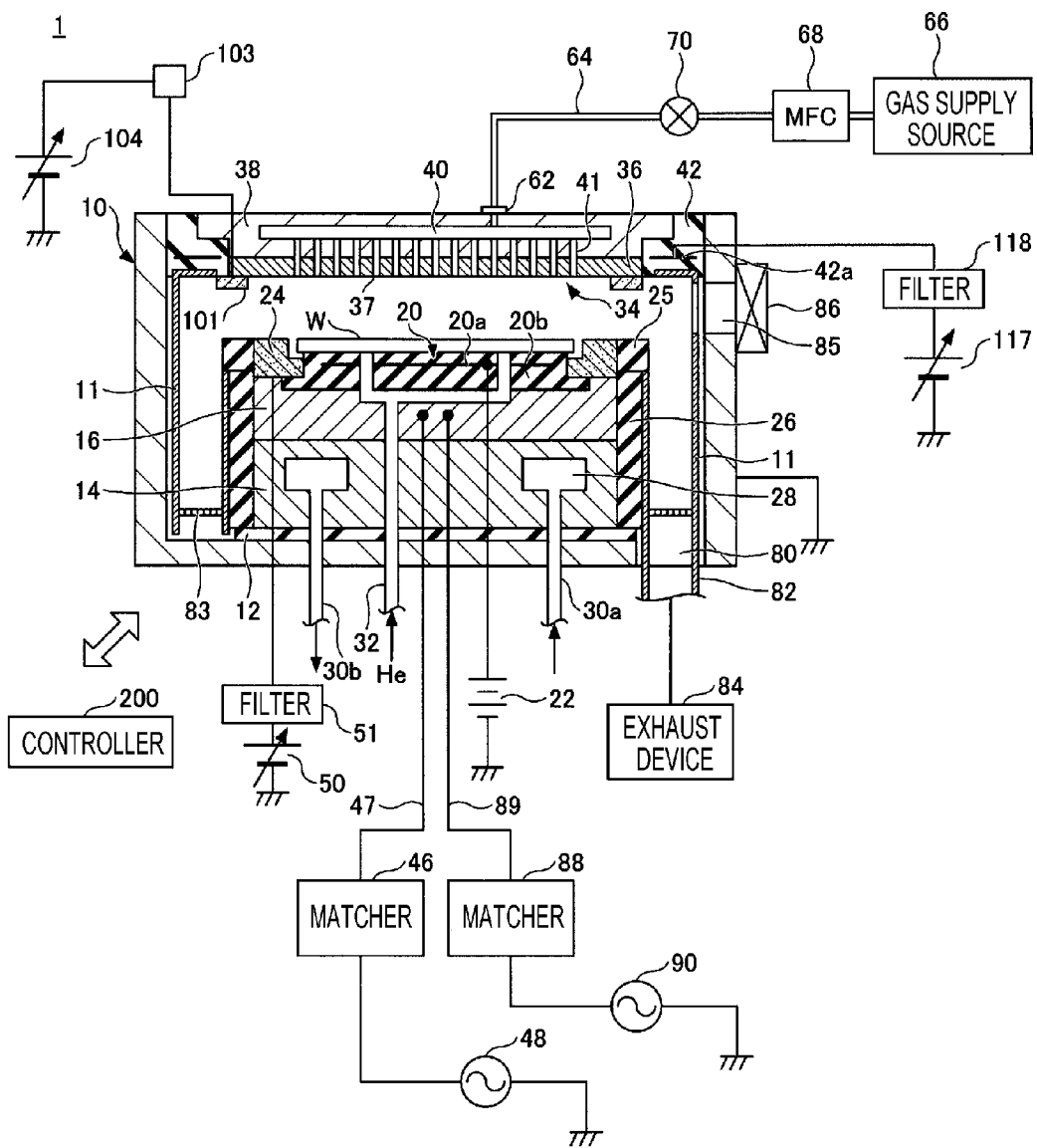
FIG. 1B is a view illustrating another exemplary plasma processing apparatus to an embodiment.

FIG. 1B is a view illustrating another example of the plasma processing apparatus 1 according to an embodiment. In FIG. 1B, an electrode 42a is provided inside a shielding member 42. The electrode 42a is electrically connected to a variable DC power supply 117 and applied with a DC voltage from the variable DC power supply 117. The variable DC power supply 117 is connected with a low-pass filter 118 configured to cut LF and HF currents and protect the variable DC power supply 117.

Further, the number of variable DC power supplies 115 is not limited to one. Two or more variable DC power supplies 115 may be connected to at least one of the parts such as deposition shield and ceiling wall. In the example illustrated in FIG. 1A, a dedicated part 101 is disposed outside the upper portion of the edge ring 24. The part 101 has therein an electrode, which is electrically connected to a variable DC power supply 104. Thus, the electrode is applied with a DC voltage from the variable DC power supply 104. The DC power supply 104 is connected with a low-pass filter 103 configured to cut LF and HF currents and protect the variable DC power supply 104. The part 101 may have a ring shape, an arc shape, or any other shape. The part 101 is made of, for example, silicon (Si) or silicon carbide (SiC).

[Configuration of Controller]

A specific configuration of the controller 200 will be described with reference to FIG. 2. The controller 200 includes a processor 100, a signal generation circuit 102, directional couplers 105 and 108, a power meter 111, and an oscilloscope 112. However, the power meter 111, the oscilloscope 112, and the directional coupler 108 may not be provided.

In the power supply line of the first radio-frequency power supply 48, the directional coupler 105 is connected between the first radio-frequency power supply 48 and the matching unit 46. In the power supply line of the second radio-frequency power supply 90, the directional coupler 108 is connected between the second radio-frequency power supply 90 and a matcher 88.

The directional coupler 105 imparts a part of the traveling wave power of LF to the oscilloscope 112. The directional coupler 108 imparts a part of the traveling wave power of HF to the oscilloscope 112. In an embodiment, the frequency of LF displayed on the oscilloscope 112 is, for example, 400 kHz, and the frequency of HF is, for example, 100 MHz. As a result, in the oscilloscope 112, the waveform of the traveling wave of LF and the waveform of the traveling wave of HF may be observed.

The directional coupler 108 imparts a part of the traveling wave of HF to the power meter 111. The power meter 111 measures the electric energy of the traveling wave of HF.

The directional coupler 105 imparts a part of the traveling wave of LF to the processor 100. The processor 100 generates a DC synchronization signal that is synchronized with the traveling wave of LF. For example, the processor 100 may generate a synchronization signal for DC (variable DC power supply) in synchronization with the positive timing of the traveling wave of LF. Meanwhile, instead of the directional coupler 105, LF power detected using the sensor may be imparted to the processor 100.

The processor 100 imparts the generated synchronization signal to the signal generation circuit 102. The signal generation circuit 102 generates a control signal synchronized with the traveling wave of LF from the imparted synchronization signal, and imparts the control signal to the variable DC power supply 115 and the first radio-frequency power supply 48.

There are two methods for generating the control signal as follows. When the first radio-frequency power supply 48 is a general power supply, the directional coupler 105 extracts a waveform synchronized with the phase of the LF power output from the first radio-frequency power supply 48 and inputs the waveform to the processor 100. However, the present disclosure is not limited to this, and the processor 100 may input the waveform synchronized with the phase of the LF power directly from the first radio-frequency power supply 48. Hereinafter, a waveform synchronized with the phase of the LF power, a waveform synchronized with the phase of the LF voltage or the LF current, and a waveform synchronized with the power, voltage, or current of the DC pulse will be also referred to as a bias waveform. The DC pulse refers to a pulse-like voltage corresponding a peak of the LF voltage. The bias power of a desired waveform corresponds to an LF power of the bias waveform.

The processor 100 generates an ON signal having an arbitrary delay and an arbitrary width in synchronization with the signal having the input waveform or from the signal and transmits the ON signal to the signal generation circuit 102. The processor 100 may generate an LF signal for controlling the first radio-frequency power supply 48 without inputting a waveform synchronized with the phase of the LF power from the first radio-frequency power supply 48, and generate an ON signal having an arbitrary delay and arbitrary width in synchronization with the LF signal or from the LF signal. The ON signal is an example of the synchronization signal.

The signal generation circuit 102 sends a command signal to the variable DC power supply 115 in order to generate a DC voltage during the ON signal. As the command signal, a control signal for generating a DC voltage during the ON signal or the ON signal itself is used depending on the input form of the variable DC power supply 115. Similarly, the signal generation circuit 102 may transmit the command signal to the second radio-frequency power supply 90 in order to generate HF power during the ON signal.

When the first radio-frequency power supply 48 is an amplifier that amplifies LF power, voltage, or current, the signal generation circuit 102 may extract a part of the waveform LF synchronized with the phase of the LF power output from the first radio-frequency power supply 48 as a waveform, and may generate an ON signal having an arbitrary delay and an arbitrary width from the signal having the above waveform without using the signal from the directional coupler 105. The signal generation circuit 102 transmits the signal having the above waveform and the ON signal to the variable DC power supply 115.

For example, an AC power supply (not illustrated) may be provided instead of the variable DC power supply 115, the AC power supply may be electrically connected to a part such as the deposition shield, and a radio-frequency voltage may be supplied from the AC power supply to a part such as the deposition shield based on the control (ON) signal. The variable DC power supply 115 and the AC power supply are examples of power supplies that supply a voltage of a desired waveform to a part. The AC power supply may be the second radio-frequency power supply 90 or any other RF power supply.

Figure 3A:
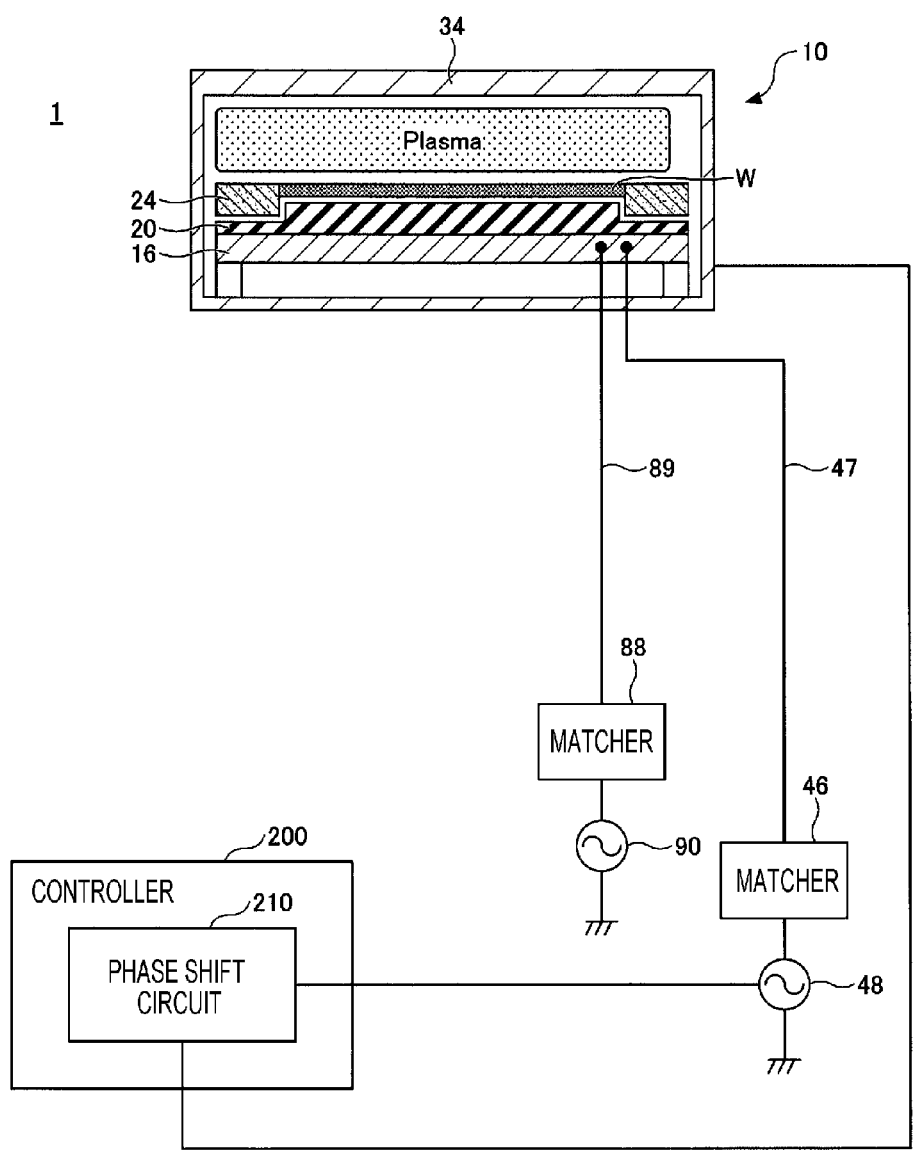
FIG. 3A is a view for explaining generation of a control signal according to a modification of an embodiment.

In addition, as illustrated in FIG. 3A, a part of the waveform LF synchronized with the phase of the LF power output from the first radio-frequency power supply 48 is input to a phase shift circuit 210 provided in the controller 200, and the radio-frequency voltage obtained by shifting the phase of LF shifted by a predetermined amount in the phase shift circuit 210 may be applied to a part such as the deposition shield.

Instead of shifting the phase of LF by a predetermined amount in the phase shift circuit 210, a radio-frequency voltage having an arbitrary delay and an arbitrary width may be generated from the waveform of LF output from the first radio-frequency power supply 48, and the generated radio-frequency voltage may be applied to a part such as the deposition shield.

However, the above-described control signal generation method is an example, and the present disclosure is not limited thereto. When it is possible to generate a control signal for performing control to apply at least one of a DC voltage and a radio-frequency voltage in a partial period within each cycle of the imparted periodically varying parameter, other hardware or software may be used without being limited to the circuit of the controller 200 illustrated in FIG. 2. In the case of a DC voltage, for example, a control signal for controlling the DC voltage such that ON and OFF are alternately repeated may be generated.

The amplifier of the first radio-frequency power supply 48 amplifies the amplitude of the modulation signal of 400 kHz LF (amplitude modulation: AM) and supplies the amplified modulation signal to the lower electrode. The amplifier of the second radio-frequency power supply 90 amplifies the amplitude of the modulation signal of 100 MHz HF and supplies the amplified modulation signal to the lower electrode.

The signal generation circuit 102 may apply a DC voltage in a partial period within each cycle of a periodically varying parameter measured from an imparted synchronization signal in a bias power transmission path, generate a control signal for controlling the absolute values of the DC voltage such that High and Low are alternately repeated, and impart the control signal to the variable DC power supply 115. When LF is not applied, the processor 100 may generate a DC synchronization signal in synchronization with the timing at which the traveling wave of HF has a positive peak.

Figure 3B:
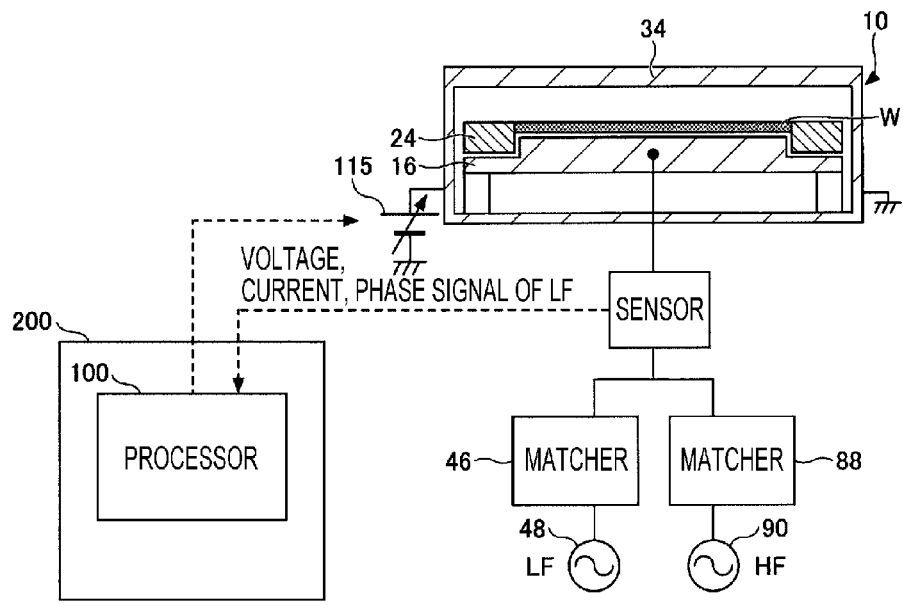
FIG. 3B is a view illustrating an example in which a control is performed using a phase signal of a sensor attached to a power feeding system according to an embodiment.
Figure 3C:
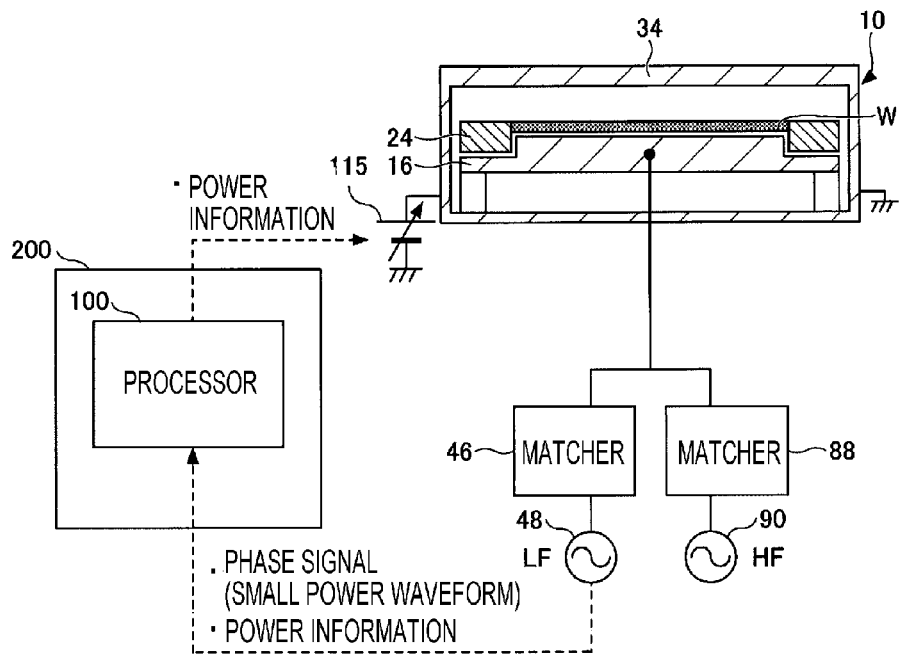
FIG. 3C is a view illustrating an example in which a control is performed using a signal synchronized with a radio-frequency of a bias power or a cycle of a pulse wave according to an embodiment.

The signal generation circuit 102 may apply a radio-frequency voltage in a partial period within each cycle of a periodically varying parameter measured from an imparted synchronization signal in a bias power transmission path, generate a control signal for controlling the radio-frequency voltage such that High and Low are alternately repeated, and impart the control signal to the variable DC power supply 115. The partial period may include a timing at which an electrode potential becomes a positive peak, may include a timing at which the electrode potential becomes a negative peak, or may include both timings. For example, FIGS. 3B and 3C illustrate an example in which any one of the voltage, current, and electromagnetic field measured on the transmission path (power feeding system) of the bias power is set as a "reference electric state." For example, in FIG. 3B, the processor 100 inputs any one of the HF voltage or current, the LF voltage or current, the HF phase signal, or the LF phase signal from a sensor such as a VI probe attached to the transmission path. The processor 100 applies a DC voltage alternately in the first state and the second state in synchronization with a phase within one cycle of the reference electrical state indicating one of the HF voltage or current, the LF voltage or current, the HF phase signal, or the LF phase signal.

The processor 100 may generate a signal using a signal synchronized with a cycle of the radio-frequency or pulse wave of the bias power output from the first radio-frequency power supply 48 without being based on the signal from the sensor. In this case, the state of the signal may be set as a reference electric state. Further, the step of measuring the reference electric state in the power feeding system may be omitted. For example, in FIG. 3C, the processor 100 inputs an LF phase signal (small power waveform) or a signal related to bias power information from the first radio-frequency power supply 48, and generates a signal synchronized with a cycle of the radio-frequency or pulse wave of the bias power based on the input signal. The processor 100 outputs the generated signal to the variable DC power supply 115. The variable DC power supply 115 alternately applies a DC voltage in the first state and the second state based on this signal.

Figure 3D:
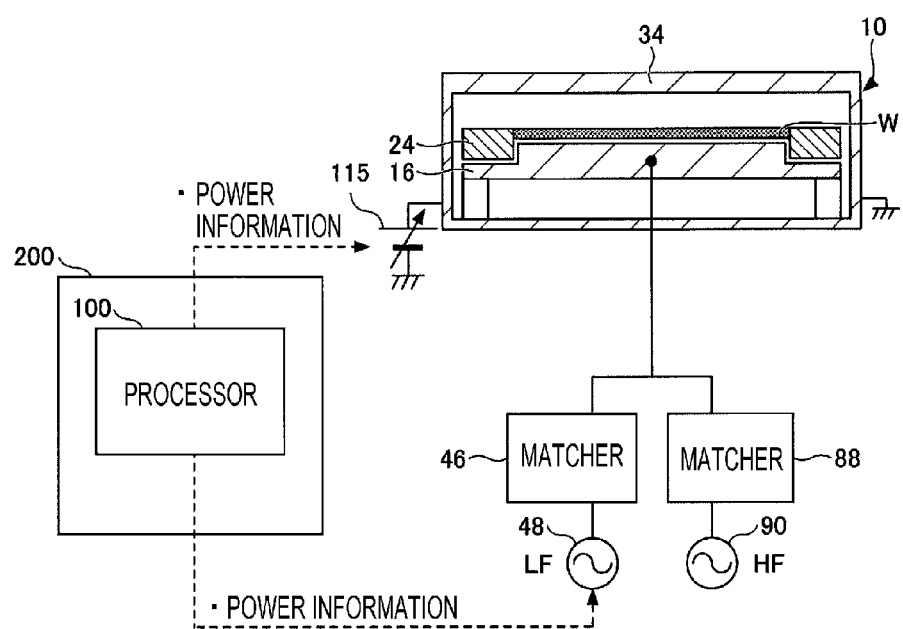
FIG. 3D is a view illustrating a view illustrating an example in which a control is performed using a signal synchronized with a radio-frequency of a bias power or a cycle of a pulse wave according to an embodiment.

As illustrated in FIG. 3D, the processor 100 may generate a signal synchronized with a cycle of the radio-frequency wave or pulse wave of the bias power output from the first radio-frequency power supply 48 by generating a signal for controlling the first radio-frequency power supply 48 without using the signal from the first radio-frequency power supply 48, and generating a signal synchronized with the generated signal. In this case, the processor 100 generates an LF signal for controlling the first radio-frequency power supply 48 and generates a DC voltage signal synchronized with the generated signal. The processor 100 transmits the generated LF signal to the first radio-frequency power supply 48 and transmits the generated DC voltage signal to the variable DC power supply 115. The first radio-frequency power supply 48 outputs a bias power based on the LF signal. The variable DC power supply 115 alternately applies the DC voltage in the first state and the second state based on a DC voltage signal. The generated LF signal and the DC voltage signal include power information.

[Relationship between Electrode Potential and Collision Energy of Ions]

Figures 4A, 4B, 4C:
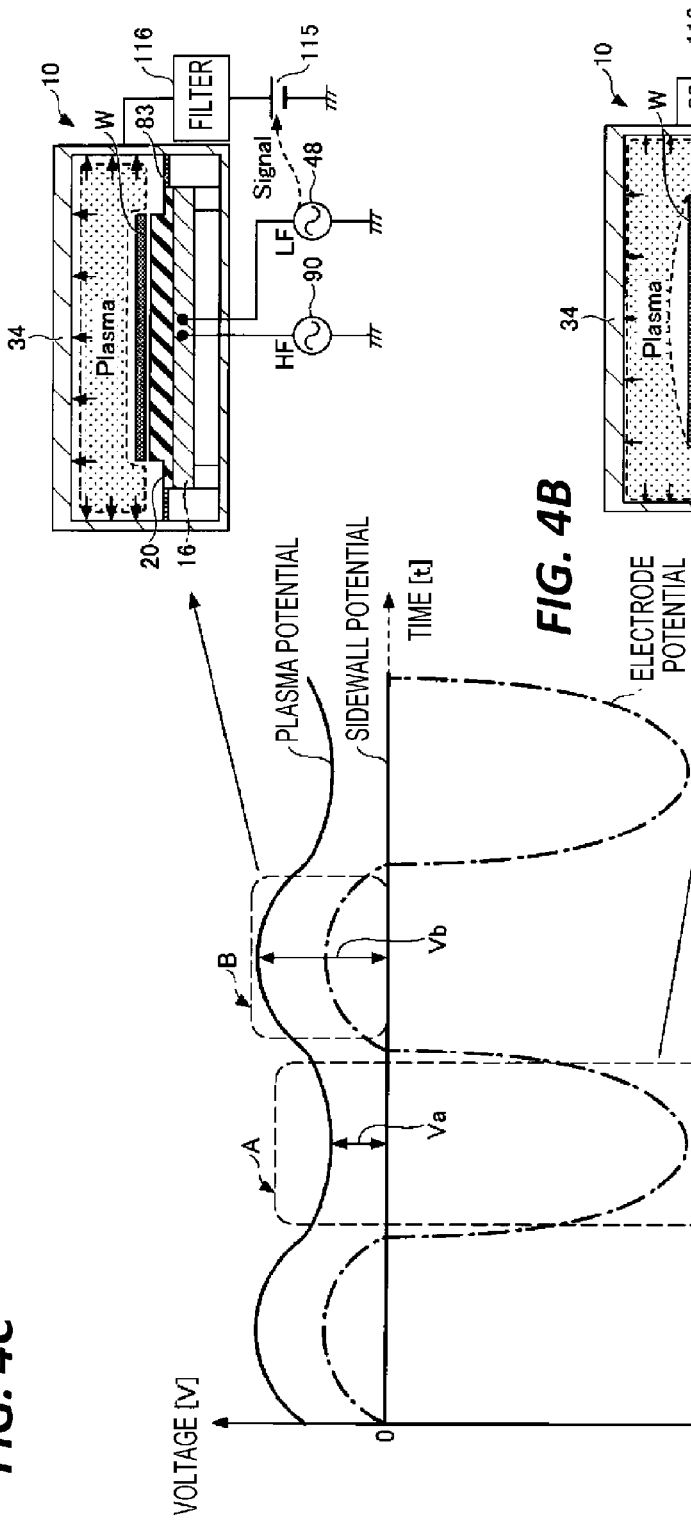
FIGS. 4A to 4C are views illustrating a relationship between an electrode potential and collision energy of ions.

Next, a relationship between an electrode potential and collision energy of ions will be described with reference to FIGS. 4A to 4C. In the case where LF power is applied as a sine wave from the first radio-frequency power supply 48, the voltage when the LF voltage is negative becomes negatively deeper by a self-bias Vdc than when the LF voltage is positive. Therefore, as represented in FIG. 4C, when the electrode potential to which the LF power is applied is positive, the electrode potential becomes higher than the potential (ground) of the sidewall. Since the plasma potential is slightly higher than the highest potential in the processing container 10, the plasma potential is slightly higher than the electrode potential when the electrode potential is positive. The potential difference Vb between the plasma potential and the sidewall potential at that time is represented in frame B in FIG. 4C.

Meanwhile, when the electrode potential to which LF power is applied is negative, the electrode potential becomes lower than the sidewall potential (ground) due to a self-bias Vdc. At this time, the plasma potential is slightly higher than the sidewall potential. The potential difference Va between the plasma potential and the sidewall potential at that time is represented in frame A in FIG. 4C. Therefore, the potential difference Vb between the plasma potential and the sidewall potential when the electrode potential is positive becomes larger than the potential difference Va between the plasma potential and the sidewall potential when the electrode potential is negative. For this reason, when the electrode potential is positive, the acceleration voltage of ions toward the sidewall increases, and the collision energy per one ion to the sidewall increases. As a result, sputtering on the sidewall is likely to occur. Accordingly, when the acceleration voltage is controlled by controlling the potential difference between the plasma potential and the potential of the sidewall and the ceiling wall depending on the electrode potential, it is possible to control the collision energy and to control a sputtering force to the sidewall and the ceiling wall. For example, when the potential difference between the plasma potential and the potential of the sidewall and the ceiling wall is controlled to be large, the sputtering force to the sidewall and the ceiling wall may be increased as indicated by arrows in FIG. 4A. Meanwhile, when the potential difference is controlled to be small, the sputtering force to the sidewall and the ceiling wall may be weakened as indicated by arrows in FIG. 4B.

Therefore, in the control method of the plasma processing apparatus 1 according to an embodiment, bias power is supplied to the lower electrode, and the DC voltage from the variable DC power supply 115 is supplied to a part such as the deposition shield 11. In addition, this control method includes a step of periodically repeating a first state in which the DC voltage has a first voltage value and a second state in which the DC voltage has a second voltage value higher than the first voltage value and step of applying the first voltage value in a partial period in each cycle of the electrode potential and applying the second voltage value such that the first state and the second state are continuous. The control method may include a step of periodically repeating the first state, the second state, and two or more states where the DC voltage has two or more voltage values, applying the first voltage value in a partial period in each cycle of a potential of the electrode, and sequentially applying the second voltage value and the two or more voltage values such that the first state, the second state, and the two or more states are continuous.

The controller 200 generates a synchronization signal synchronized with the cycle of the electrode potential, generates a control signal for a DC power supply that outputs a DC voltage from the synchronization signal, and transmits the control signal to at least of the variable DC power supply 115 and the phase shift circuit 210. The period of the electrode potential is synchronized with a period of the bias waveform. Thus, the controller 200 supplies a DC voltage to a part such as the deposition shield 11 from at least one of the variable DC power supply 115 and the phase shift circuit 210. For example, a storage medium having a program including a first control procedure is provided in which to first state in which the DC voltage has a first voltage value and a second state in which the DC voltage has a second voltage value higher than the first voltage value are periodically repeated, the first voltage value is applied in a partial period in each cycle of the electrode potential, and the second voltage value is applied such that the first state and the second state are continuous. Then, the controller 200 executes the program of the storage medium. Hereinafter, a case where a DC voltage is applied to the variable DC power supply 115 will be described as an example.

[Supply Timing of DC Voltage]

Figure 5A:
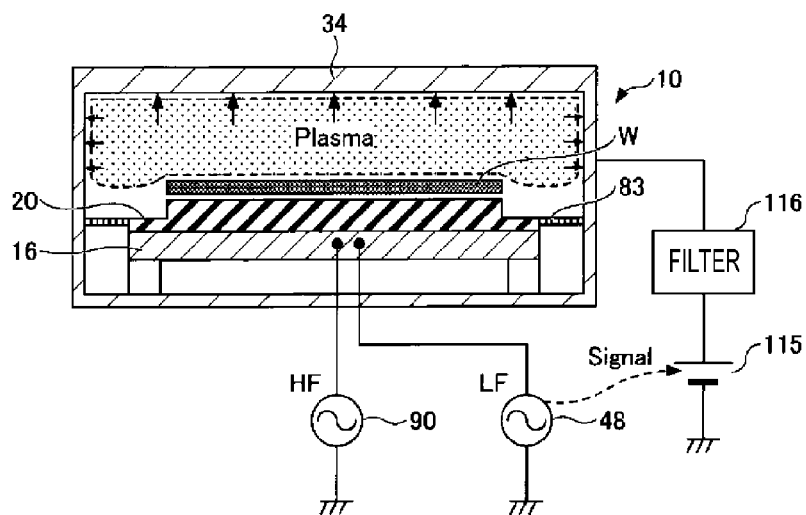
FIGS. 5A and 5B are views illustrating an exemplary DC voltage application method (sputtering control) according to an embodiment.
Figure 5B:
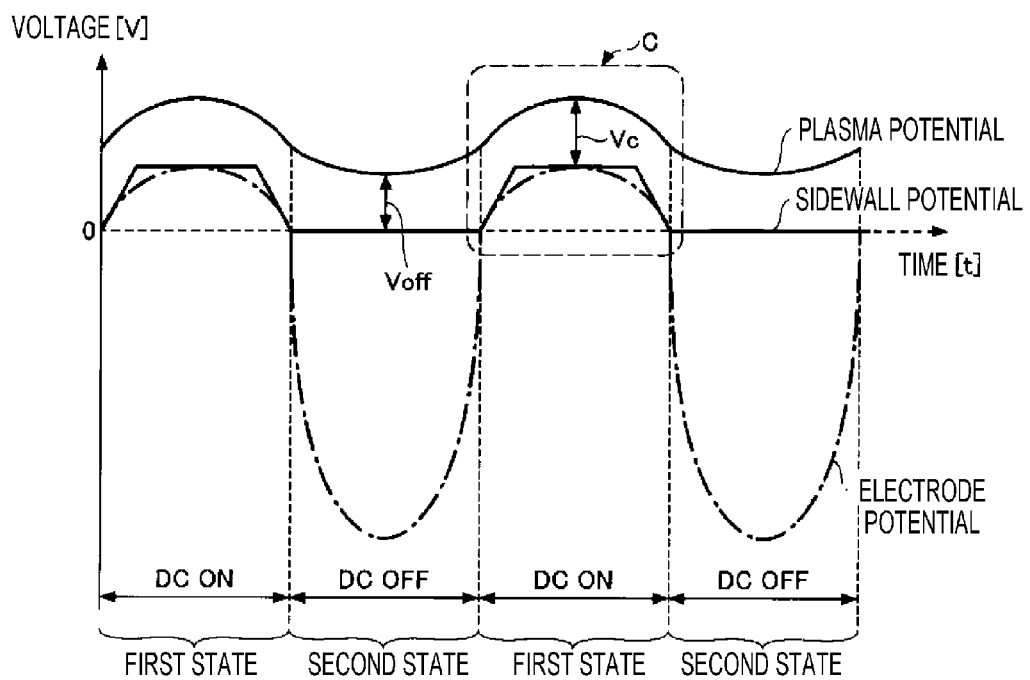

The effect of DC voltage supply timing in the present embodiment will be described with reference to FIGS. 5A and 5B. FIGS. 5A and 5B are views illustrating an example of a DC voltage application method (sputtering control) and its effects according to an embodiment. Hereinafter, an electrode potential, a plasma potential, and a potential of the deposition shield 11 to which an LF voltage is applied when an LF voltage and a DC voltage are controlled will be described.

(Sputtering Suppression)

In FIG. 5B, the horizontal axis represents time, and the vertical axis represents an electrode potential, a plasma potential, and a potential of the deposition shield 11 when an LF voltage is supplied. The electrode potential is approximately equal to the LF voltage. As represented in frame C in FIG. 5B, when the LF voltage is positive, a positive DC voltage is applied from the variable DC power supply 115 to the deposition shield 11. Thus, it is possible to reduce the potential difference between the plasma potential and the potential of the deposition shield 11, and to suppress the sputtering force to the sidewall as indicated by arrows in FIG. 5A.

As illustrated in FIG. 5B, when the LF voltage is negative, the application of the DC voltage from the variable DC power supply 115 is stopped, and the DC voltage applied to the deposition shield 11 becomes zero. As the DC voltage, not only a rectangular wave in which the electrode potential coincides with the positive timing but also a substantially rectangular wave including at least one of slow-up of rising and slow-down of falling may be applied.

The controller 200 generates a DC power supply control signal that applies a positive DC voltage when the LF voltage is positive from the synchronization signal synchronized with the cycle of the electrode potential and stops applying the DC voltage when the LF voltage is negative, and transmits the control signal to the variable DC power supply 115. The state in which in which a positive DC voltage is applied when the LF voltage is positive is an example of the first state, and the state in which the application of the DC voltage is stopped when the LF voltage is negative is an example of the second state. When receiving the control signal, the variable DC power supply 115 alternately applies the first state and the second state of the DC voltage in synchronization with the cycle of the electrode potential.

When the electrode potential to which the LF power is applied is negative, the application of the DC voltage from the variable DC power supply 115 is stopped, and the potential difference Voff between the plasma potential and the potential of the deposition shield 11 becomes an acceleration voltage for accelerating ions toward the sidewall. Accordingly, the collision energy to sidewall per one ion is determined by the potential difference Voff.

Meanwhile, when the electrode potential shown in frame C of FIG. 5B is positive, the DC voltage from the variable DC power supply 115 is turned ON, and the positive DC voltage is applied to the deposition shield 11. Then, the potential difference Vc between the plasma potential and the potential of the deposition shield 11 becomes an acceleration voltage, and the collision energy per one ion to the sidewall is determined by the potential difference Vc. The potential difference Vc between the plasma potential and the potential of the deposition shield 11 is smaller than that that in the case where the positive DC voltage from the variable DC power supply 115 is not applied to the deposition shield 11. For this reason, the collision energy of per one ion to the sidewall is lower than that in the case where no positive DC voltage is applied to the deposition shield 11. Thus, when the electrode potential is negative, the potential difference Voff between the plasma potential and the sidewall potential is small. Whereas, when the positive DC voltage from the variable DC power supply 115 is not turned ON, the potential difference between the plasma potential and the potential of the deposition shield 11 is large because the electrode potential is larger than the wall potential when the electrode potential is positive. For this reason, it is possible to suppress the sputtering power to the deposition shield 11 by turning ON the positive DC voltage from the variable DC power supply 115 and controlling the potential difference between the plasma potential and the potential of the deposition shield 11 to be small. Thus, it is possible to perform the same control as the control that makes the collision energy of one ion per unit area by controlling a cathode/anode ratio by increasing the area of the sidewall compared with the lower electrode in the processing container 10. Thus, it is possible to reduce the influence of sputtering to the sidewall on the process by reducing the collision energy of one ion per unit area. Meanwhile, the first state and the second state are not limited to the control set by turning ON/OFF the positive DC voltage from the variable DC power supply 115. The first state and the second state may be controlled to be set by setting the positive DC voltage from the variable DC power supply 115 to High/Low.

When it is desired to reduce the collision energy of ions to the sidewall, it is possible to the effect of ions hitting the sidewall when the electrode potential is positive by controlling the positive DC voltage to the sidewall to be turned ON when the electrode potential is positive. In this way, it is possible to extend the lifetime of the sidewall of the processing container by suppressing collision energy of ions to the deposition shield 11. In addition, it is possible to reduce particles by suppressing the collision energy of ions to the sidewall. In addition, it is possible to extend a cleaning cycle by suppressing the collision energy of ions to the sidewall.

Furthermore, it is possible to the energy with which the ions hit the wafer W when the electrode potential is negative by controlling the positive DC voltage to be turned OFF when the electrode potential is negative.

(Cleaning/Specific Process)

The period of the first state described above includes the timing at which the electrode potential becomes a positive peak, and a positive or negative DC voltage may be applied to the part. The period of the first state includes the timing at which the electrode potential becomes a negative peak, and a positive or negative DC voltage may be applied to the part.

FIGS. 6A to 6C are views illustrating an example of positive and negative electrode potentials and collision energy of ions according to an embodiment. As represented in frame H in FIG. 6C, for example, when a positive DC voltage is applied to the deposition shield 11 and the ceiling wall (e.g., the shielding member 42) when the electrode potential is positive, the potential difference between the plasma potential and the potential of the deposition shield 11 is changed from H1 to H2, and thus the collision energy of per one ion to the sidewall is reduced. As a result, it is possible to reduce the sputtering force to the sidewall and the ceiling wall. Meanwhile, when a negative DC voltage is applied to the deposition shield 11 and the ceiling wall when the electrode potential is positive, the potential difference between the plasma potential and the potential of the deposition shield 11 increases, and thus the collision energy per one ion to the sidewall increases. As a result, it is possible to increase the sputtering force to the sidewall and the ceiling wall. In this way, as illustrated in FIG. 6A, it is possible to control the collision energy per one ion to the sidewall and ceiling wall.

Figure 7A:
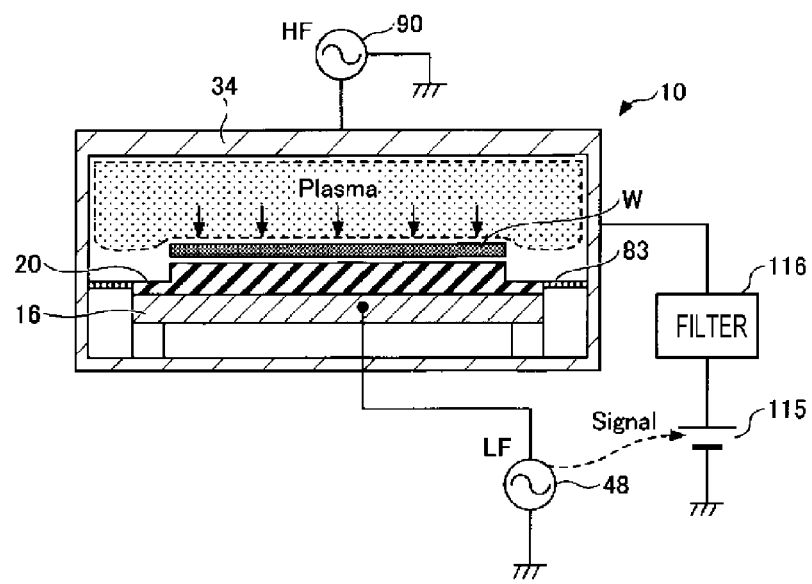
FIGS. 7A and 7B are views illustrating an exemplary DC voltage application method (cleaning) according to an embodiment.
Figure 7B:
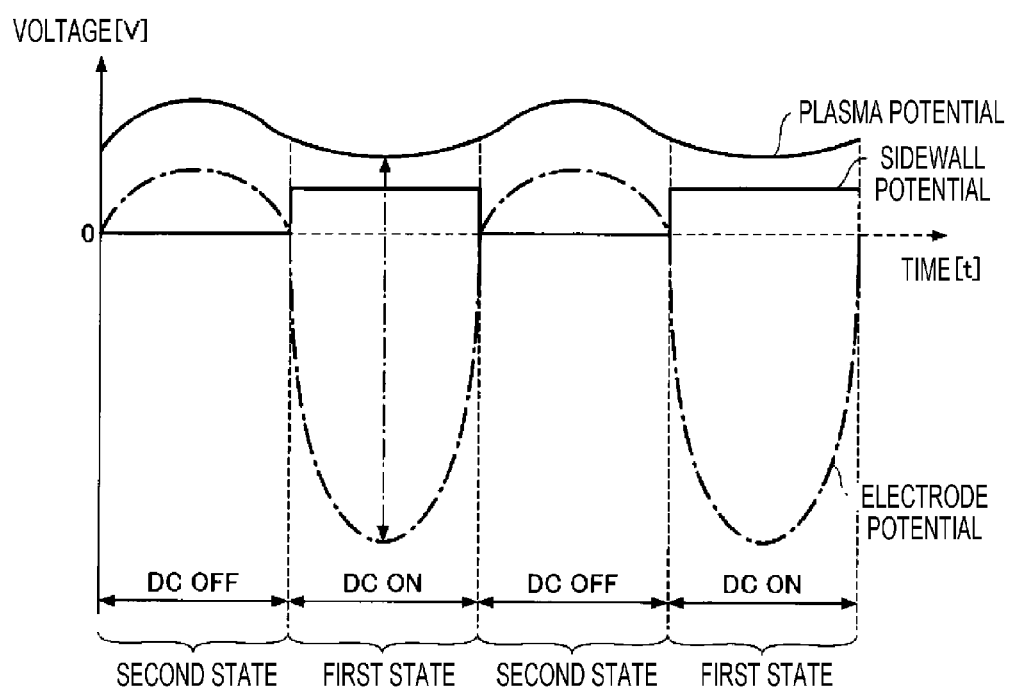

In addition, as represented in frame G in FIG. 6C, by applying a DC voltage to the deposition shield 11 and the ceiling wall when the electrode potential is negative, it is possible to control the collision energy per one ion to the wafer W as illustrated in FIG. 6B. For example, as represented in FIG. 7B, when a positive DC voltage is applied to the deposition shield 11 when the electrode potential is negative, the potential difference between the plasma potential and the electrode potential increases and the collision energy per one ion to the wafer W increases as indicated by arrows in FIG. 7A. Therefore, it is possible to improve process efficiency. For example, in manufacturing an MRAM, several tens of layers of metal are etched. There is a process in which it is desired to deeply etch a hole by hitting a wafer with ions having high ion energy. In such a process, it is possible to cause ions having high ion energy to hit the wafer W by stopping the application of the DC voltage when the electrode potential is positive, and by applying the positive DC voltage to the deposition shield 11 when the electrode potential is negative. Therefore, it is possible to improve productivity by increasing the collision energy of ions to the wafer in the process so as to increase the processing efficiency of the process.

During the cleaning process, a negative DC voltage is applied to the deposition shield 11 when the electrode potential is positive so as to increase the collision energy per one ion to the sidewall, and the application of the DC voltage to the deposition shield 11 is stopped when the electrode potential is negative. Thus, by increasing or changing the collision energy of ions to the sidewall so as to control the ion energy to the optimum ion energy, it is possible to extend the cleaning cycle and to shorten the cleaning time. During the cleaning process, a negative DC voltage, which is the same as that when the electrode potential is positive, may be continuously applied even when the electrode potential is negative without being limited to the control in which a negative DC voltage is applied to the deposition shield 11 when the electrode potential is positive and the application of the DC voltage is stopped when the electrode potential is negative. When a negative DC is applied to the deposition shield 11 when the electrode potential is negative, the potential difference between the plasma potential and the electrode potential is reduced, and the collision energy per one ion to the wafer is reduced. Therefore, in the cleaning of WLDC, it is possible to reduce damage to the placement surface of the stage on which the wafer is placed.

For example, in the case of a process in which it is desired to deposit a byproduct on the sidewall or a sputtered product on the ceiling wall on a wafer, it is possible to deposit, for example, the byproduct on the wafer by applying a negative DC voltage is applied to the deposition shield 11 when the electrode potential is positive, thereby making ions easily hit the wall surface. Meanwhile, in the case of a process in which it is not desired to deposit, for example, a byproduct of the sidewall on a wafer, or a process in which it is not desired to sputter the sidewall as much as possible, it is possible to prevent, for example, the byproduct from being deposited on the wafer by applying a positive DC voltage to the deposition shield 11 when the electrode potential is positive, thereby making it difficult for ions to hit the wafer.

As described above, by controlling the collision energy of ions to the sidewall depending on the positive/negative and the magnitude of the DC voltage applied to the deposition shield 11, a control of applying high bias power is enabled. Furthermore, with the control of the positive/negative and the magnitude of the DC voltage, the bias power to be supplied may be further increased and applied.

Figure 8A:
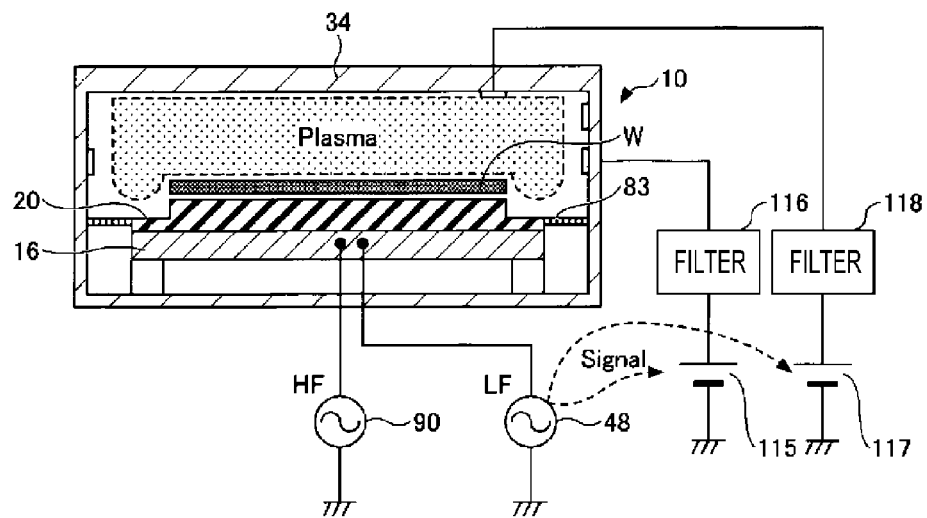
FIGS. 8A and 8B are views illustrating an exemplary method of applying a DC voltage to a plurality of DC power supplies according to an embodiment.

A DC voltage may be applied to a plurality of parts using a plurality of variable DC power supplies. For example, as illustrated in FIG. 8A, the variable DC power supply 115 may be electrically connected to the deposition shield 11 of the processing container 10, and the variable DC power supply 117 may be electrically connected to a part of the ceiling wall of the processing container 10. The variable DC power supply 115 is connected with a low-pass filter 116 configured to cut LF and HF currents and protect the variable DC power supply 115. The variable DC power supply 117 is connected with a low-pass filter 118 configured to cut LF and HF currents and protect the variable DC power supply 117.

For example, when LF power and HF power are applied to the lower electrode, a byproduct is likely to adhere to the upper electrode. Therefore, the variable DC power supply 117 connected to the ceiling wall where the byproduct is likely to adhere applies a negative DC voltage to the deposition shield 11 when the electrode potential is positive, as indicated by E in FIG. 8B. This increases the potential difference between the plasma potential and the ceiling wall potential and increases the collision energy of ions to the ceiling wall, thereby increasing the sputtering force to the ceiling wall, which makes it easy to remove the byproduct attached to the ceiling wall. In addition, the variable DC power supply 115 connected to the deposition shield 11 where the byproduct is less likely to adhere than the ceiling wall applies a positive DC voltage to the deposition shield 11 when the electrode potential is positive, as indicated by D in FIG. 8B. This reduce the potential difference between the plasma potential and the potential of the deposition shield 11 and reduces the collision energy of ions to the sidewall, and thereby reducing the sputtering force to the sidewall. As a result, even if the amount of attached byproduct varies depending on a plurality of parts, it is possible to appropriately remove the byproduct for each part using a plurality of variable DC power supplies 115 and 117 so that the cleaning times can be made to be equal.

In addition, the temperature is different between the upper electrode and the sidewall, and the temperature of the upper electrode is higher than that of the sidewall. That is, since plasma is generated in the vicinity of the upper electrode, the temperature is high and the number of ions is large in the vicinity of the upper electrode. In contrast, the temperature of the sidewall is lower than that of the upper electrode, and the number of ions on the sidewall is smaller than that on the upper electrode. The collision energy of ions is determined by the temperature and the acceleration voltage. Therefore, in consideration of this, the DC voltage applied to a plurality of parts from a plurality of variable DC power supplies may be controlled.

[Control Method]

As described above, the control method of the parallel plate plasma processing apparatus 1 according to the embodiment includes a step of supplying bias power to the stage 16 on which a wafer W is placed, and a step of supplying a DC voltage to a part exposed to the plasma within the processing container.

In this control method, the DC voltage periodically repeats a first state in which the DC voltage has a first voltage value and a second state in which the DC voltage has a second voltage value higher than the first voltage value, the first voltage value is applied in a partial period in each cycle of the electrode potential, and the second voltage value is applied such that the first state and the second state are continuous. The electrode potential is determined by a periodically varying parameter measured in the transmission path of the bias power, and the periodically varying parameter may be a voltage, a current, an electromagnetic field, a change in light emission of generated plasma, or a change in sheath thickness of the plasma on an object to be processed.

Figure 8B:
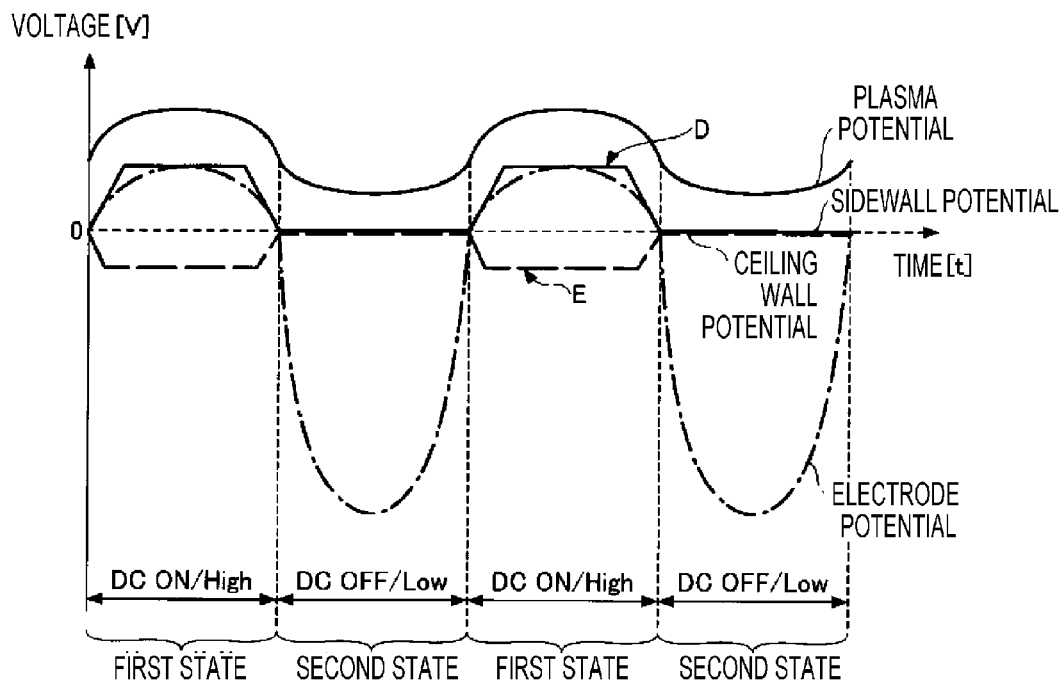
Figure 10A:
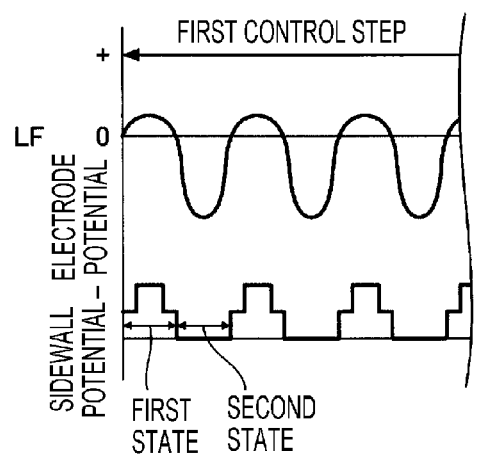
FIG. 10A is a timing chart illustrating a control method according to Modification 1-2 of an embodiment.
Figure 10B:
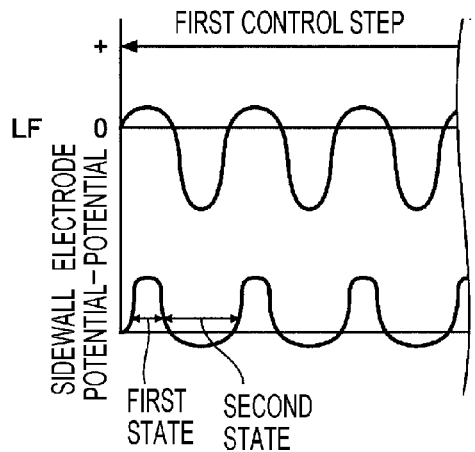
FIG. 10B is a timing chart illustrating a control method according to Modification 1-3 of an embodiment.

For example, in the example of FIGS. 8A and 8B, a DC voltage is applied during a partial period in which the periodically varying parameter, for example, the electrode potential, has a positive value such that that the potential of the deposition shield 11 is in the first state, and the second state is applied continuously with the first state. In FIGS. 5A and 5B, FIGS. 7A and 7B, FIGS. 8A and 8B, deposition shield 11, and FIG. 10A, the DC voltage has a positive (or negative) voltage value in the first state, and the voltage value of the DC voltage is zero in the second state. In FIG. 10B, the DC voltage is a positive voltage value in the first state, and has a negative voltage value in the second state.

As represented in FIGS. 5A and 5B, and FIG. 7A to FIG. 10A, the state in which the DC voltage applied to a part is turned ON (DC ON, that is, DC is applied positively or negatively) is an example of the first state having the first voltage value. The state in which the DC voltage applied to a part is OFF (DC OFF, that is, DC is 0) or has a voltage value different from the first state is an example of the second state having a second voltage value higher than the first voltage value.

Meanwhile, the first state and the second state are not limited to the state in which the DC voltage applied to a part is controlled to be ON and OFF, and includes a state in which the absolute values of a voltage are controlled to be Low and High.

The period of the first state includes a timing at which the potential of the first electrode or the second electrode becomes a positive peak, and a positive or negative DC voltage may be applied to the part. The period of the first state includes a timing at which the potential of the first electrode or the second electrode becomes a negative peak, and a positive or negative DC voltage may be applied to the part.

In addition, the DC voltage may be applied to the part from a timing at which the electrode potential is positive to a timing at which the electrode potential has an arbitrary delay and an arbitrary width. For example, the DC voltage may be applied to the part at at least one of the timing shifted rearward by a predetermined time from the timing when the electrode potential is positive and the timing shifted forward by a predetermined time. Particularly, the positive side waveform of the electrode potential may be distorted depending on the frequency of LF, gas type, or pressure. In such a case, the DC voltage may be applied by shifting the timing by a predetermined time from the timing at which the electrode potential is positive and selecting a phase at which the sheath is thinner so as to allow electrons to easily enter. In addition, the width of application time of the DC voltage may be adjusted so as to be longer or shorter than the timing at which the electrode potential is positive by a predetermined time.

Both the DC voltage and the HF voltage may be controlled to be turned ON/OR or to be High/Low in synchronization with the cycle of the LF voltage. At this time, the HF voltage may be supplied at one timing at which the electrode potential is either positive or negative, and the supply of the HF voltage may be stopped at another timing where the electrode potential is positive or negative. The HF voltage may be controlled at the same timing as the DC voltage application timing.

In addition, for example, there is a case where the LF power is not applied in order to reduce damage to the stage 16 in the cleaning process of WLDC. In this case, the controller 200 may alternately apply the first state and the second state of the DC voltage in synchronization with the cycle of source power in order to make the first state and the second state of the DC voltage synchronize with the electrode potential. In particular, by applying the HF voltage to the upper electrode, it is possible to reduce damage to the wafer during WLDC. In this case, the stage 16 is regarded as a wall. An RF power supply that applies RF power to the stage 16 may be provided separately, and when the potential of the upper electrode is high, the RF power may be applied to the stage 16 from the RF power supply to control the wafer potential to be high. This makes it possible to suppress damage to the stage by controlling the potential difference between the upper electrode potential and the wafer potential to be small. In this case, RF power having a frequency equal to or higher than the frequency of LF may be applied.

[Modifications 1-1 to 1-3]

Figure 9:
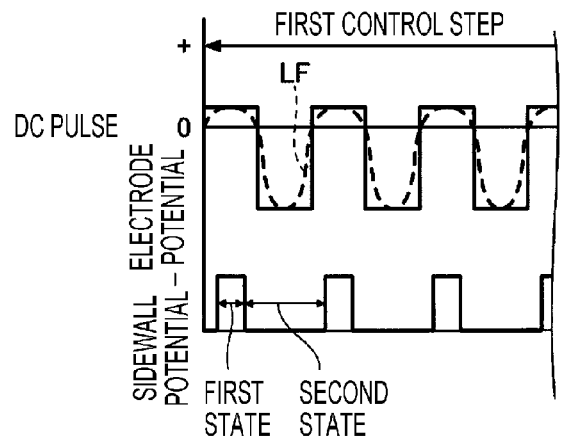
FIG. 9 is a timing chart illustrating a control method according to Modification 1-1 of an embodiment.

Next, a method for controlling a plasma processing apparatus 1 according to each of Modifications 1-1 to 1-3 of an embodiment will be described. FIG. 9 and FIGS. 10A and 10B are timing charts representing control methods according to Modifications 1-1 to 1-3 of an embodiment, respectively. In Modification 1-1 of FIG. 9, the voltage of the DC pulse alternately repeats the first state and the second state one or more times in a first control step. In the first control step, the frequency of LF may be, for example, 0.1 Hz to 100 Hz.

In Modification 1-1 of FIG. 9, a DC pulse is applied to the stage 16. The positive value of the voltage the DC pulse voltage corresponds to the positive peak of the LF voltage, and the negative value or zero of the voltage of the DC pulse corresponds to the negative peak of the LF voltage. The DC voltage is alternately applied in synchronization with the voltage of the DC pulse such that the voltage of the DC pulse becomes the first state and the second state. Specifically, the DC voltage may be controlled such that the potential of the deposition shield 11 becomes the first state at a timing when the voltage of the DC pulse is positive, and the potential of the deposition shield 11 becomes the second state at a timing when the voltage of the DC pulse is negative. According to this, since the voltage of the DC pulse is binarized and thus the DC voltage is binarized and controlled, the control of applying the DC voltage becomes easy. Meanwhile, instead of periodically turning ON/OFF the DC voltage, the DC voltage may be controlled to be periodically High/Low.

In Modification 1-2 of FIG. 10A, in the first state, the DC voltage is positive and has two or more voltage values stepwise, and is controlled to be 0 in the second state. In addition, in Modification 1-3 of FIG. 10B, in the first state, the DC voltage is positive value and smoothly has two or more voltage values, and in the second state, the DC voltage smoothly has a negative voltage value. In Modifications 1-2 and 1-3, it is possible to control ion energy with higher accuracy by controlling the DC voltage in the first state or the second state to a plurality of values.

In the above-described embodiments and modifications, a control method for applying a DC voltage in synchronization with the cycle of a bias power voltage has been described as an example of a control method for applying a DC voltage in synchronization with the cycle of an electrode potential voltage. However, the DC voltage may be applied in synchronization with the cycle of a source power voltage. At least one of a DC voltage and a source power voltage may be applied in synchronization with the cycle of the bias power voltage or the source power voltage.

In the foregoing, the control method for a DC voltage applied to the deposition shield 11 of the processing container 10 from the variable DC power supply 115 or the variable DC power supply 117 has been described. However, the control method is not limited thereto. For example, a radio-frequency voltage applied to the deposition shield 11 of the processing container 10 may also be controlled in the same manner as the control method for the DC voltage.

That is, the plasma processing apparatus according to the present embodiment may include: a processing container; an electrode configured to place a substrate thereon within the processing container; a plasma generation source configured to supply plasma into the processing container; a bias power supply configured to supply bias power to the electrode; a part exposed to the plasma in the processing container; a radio-frequency power supply configured to supply a radio-frequency voltage having a frequency, which is the same as the frequency of the voltage of the bias power; a storage medium having a program including a first control procedure in which the radio-frequency voltage is applied so as to generate a predetermined phase difference with respect to the phase of the potential of the electrode; and a controller configured to execute the program of the storage medium. The predetermined phase difference may be 90° to 270°.

In addition, a control signal for a radio-frequency voltage output from a bias power supply may be generated, the generated control signal may be transmitted to a phase shift circuit, and the radio-frequency voltage may be supplied from the phase shift circuit to the edge ring.

Furthermore, a voltage obtained by synthesizing another voltage with the DC voltage, for example, by synthesizing a voltage output in a triangular wave with the DC voltage, may be applied.

The program may be set at a predetermined position in the state of being stored in a portable computer-readable storage medium such as a CD-ROM or DVD, and may be read by the controller.

[Modifications 1-4 to 1-6]

Figure 11:
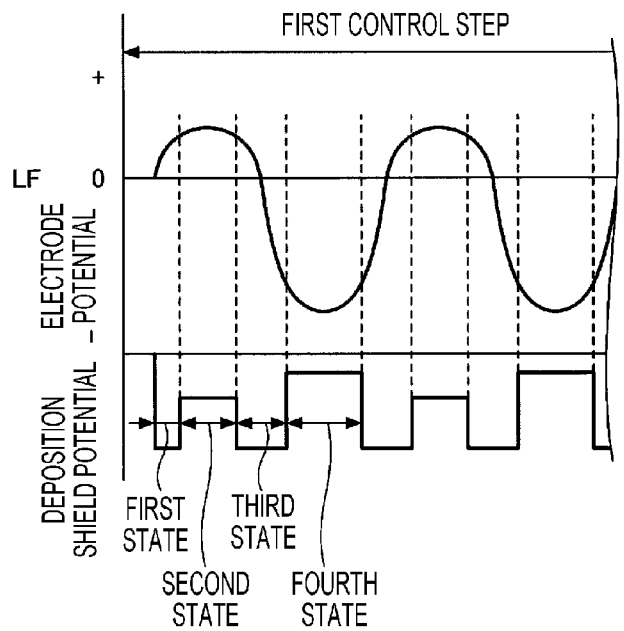
FIG. 11 is a timing chart illustrating a control method according to Modification 1-4 of an embodiment.
Figure 12:
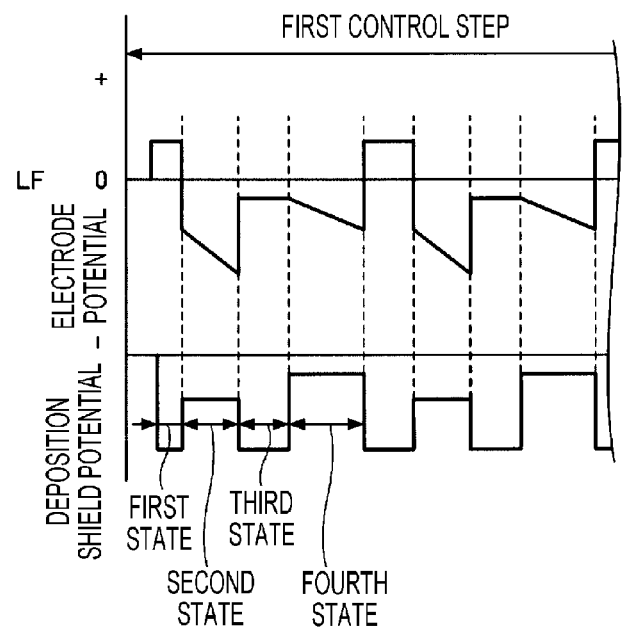
FIG. 12 is a timing chart illustrating a control method according to Modification 1-5 of an embodiment.
Figure 13:
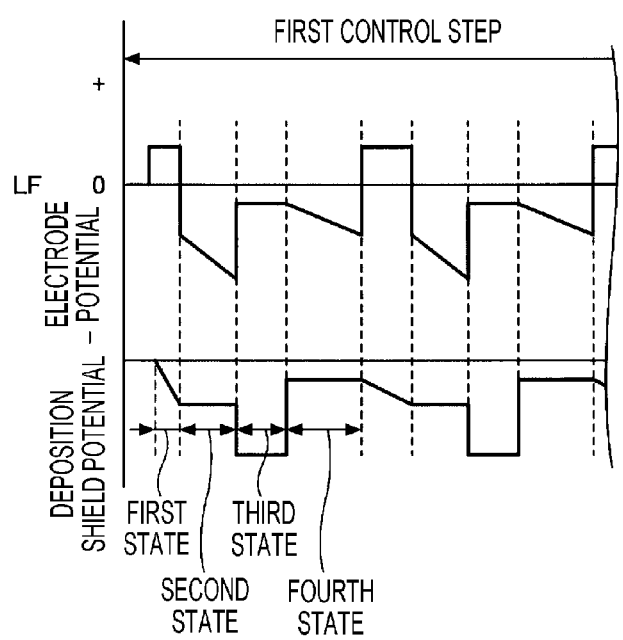
FIG. 13 is a timing chart illustrating a control method according to Modification 1-6 of an embodiment.

Next, a method for controlling a plasma processing apparatus 1 according to each of Modifications 1-4 to 1-6 of an embodiment will be described with reference to FIGS. 11 to 13. FIG. 11 is a timing chart illustrating a control method according to Modification 1-4 of an embodiment. FIG. 12 is a timing chart illustrating a control method according to Modification 1-5 of an embodiment. FIG. 13 is a timing chart illustrating a control method according to Modification 1-6 of an embodiment.

In Modification 1-4 of FIG. 11, the DC voltage is divided into four zones of one cycle of the LF voltage or the bias power, controlled to a DC voltage having a predetermined value according to each zone, and applied to the deposition shield 11. That is, in the first control step, the first state of the first zone, the second state of the second zone, the third state of the third zone, and the fourth state of the fourth zone are repeated at least once in this order in accordance with a cycle of the LF. Thus, the potential of the deposition shield 11 is controlled to four states (fixed values). In Modification 1-4, the voltages applied to adjacent zones have different values and are constant. In the first control step, the frequency of LF may be, for example, 0.1 Hz to 100 Hz.

In Modification 1-5 of FIG. 12, a bias power of a desired waveform is used. The waveform of the bias power is an example of a desired waveform (bias waveform). The desired bias waveform is an arbitrary waveform as illustrated in FIG. 12. One cycle thereof is divided into four zones, and a DC voltage having a predetermined value is applied to the deposit shield 11 according to each zone. That is, in the first control step, the first state of the first zone, the second state of the second zone, the third state of the third zone, and the fourth state of the fourth zone are repeated at least once in this order in accordance with a cycle of the LF. Thus, the potential of the deposition shield 11 is controlled to four states (fixed values). In Modification 1-5, the voltages applied to adjacent zones have different values and are constant.

Also, in Modification 1-6 of FIG. 13, one cycle of the same bias waveform as in Modification 1-5 is divided into four zones, and a DC voltage having a predetermined value is applied to the deposition shield 11 according to each zone. In the first control step, the first state of the first zone, the second state of the second zone, the third state of the third zone, and the fourth state of the fourth zone are repeated at least once in this order in accordance with a cycle of the LF. Thus, the potential of the deposition shield 11 is controlled to four states (including variable values). In the example of FIG. 13, the voltage applied in the first zone is a variable value in which the potential changes from the start point to the end point while being inclined. The voltages applied in the second to third zones are fixed values. The waveform shown in the first zone is also called a tailored waveform.

As described above, instead of the first radio-frequency power supply 48 that supplies an LF power as a bias power supply that supplies a bias power to the electrode, a power supply may be provided to supply a bias power having a desired bias waveform to the electrode. In this case, a storage medium having a program including a first control procedure may be provide, in which one cycle of the bias power of the bias waveform is divided into a plurality of zones, and according to each zone, a first state where the DC voltage has a first voltage value, a second state where the DC voltage has a second voltage value different from the first voltage value, a third state where the DC voltage has a third voltage value different from the second voltage value, and a fourth state where the DC voltage has a fourth voltage value different from the third voltage value are periodically repeated, the first voltage value is applied in a partial period in each cycle of the electrode potential, the second voltage value is applied such that the first state and the second state are continuous, the third voltage value is applied such that the second state and the third state are continuous, and the second voltage value is applied such that the third state and the fourth state are continuous. Then, the control unit 200 may execute the program of the storage medium. Thus, by dividing one cycle of the bias waveform into a plurality of zones and performing a control such that a fixed or variable voltage is applied to each zone, it is possible to control the ion collision energy. The number of zones dividing one cycle of the bias waveform may be two or more. Thus, voltages in two or more states may be applied to parts such as the deposit shield 11 in one cycle of the bias waveform.

The desired bias waveform is not limited to LF (RF) and DC pulses. The desired bias waveform may be a waveform including the tailored waveform illustrated in FIGS. 12 and 13. The signal of the bias waveform may be generated by generating a signal with a transmitter (see the processor 100 in FIG. 3C), amplifying the generated signal with an amplifier, and outputting the amplified signal to a power supply that supplies power having an arbitrary waveform. The aforementioned bias power is an example of the power of the desired bias waveform. The variable DC power supply 115 is an example of a power supply that supplies a voltage of a desired bias waveform to parts. A voltage of a desired bias waveform may be supplied to the parts from an AC power supply that may be arranged in place of the variable DC power supply 115. Similarly, the first radio-frequency power supply 48 is an example of a bias power supply that supplies a power of a desired bias waveform to the electrodes. An RF power supply for applying an RF power different from the second radio-frequency power supply 90 may be separately provided on the stage 16. In this case, the second radio-frequency power supply 90 and the RF power supply are an example of a power supply that supplies a radio-frequency voltage having a frequency that is the same as or different from the frequency of the power voltage of the desired bias waveform to the parts such as the deposit shield 11.

As for the voltage applied to the deposition shield 11, the DC voltage may be turned on/off, and the power of the radio-frequency RF may be changed. In addition, a bias waveform arbitrarily formed as shown by the potential of the deposition shield 11 in FIG. 13 may be applied. The DC voltage and the power of the radio-frequency RF may be controlled, and the frequency of the radio-frequency RF may be changed. The voltage applied to parts such as the deposit shield 11 may be controlled by the controller 200 according to the process recipe.

[Modifications 2-1 to 2-4]

Next, a method for controlling a plasma processing apparatus 1 according to each of Modifications 2-1 to 2-4 of an embodiment will be described. In Modifications 2-1 to 2-4, a control is performed to intermittently stop one or both of the bias power and the DC voltage. FIGS. 14A to 14D are timing charts illustrating a control method according to Modifications 2-1 to 2-4 of an embodiment, respectively.

Figure 14A:
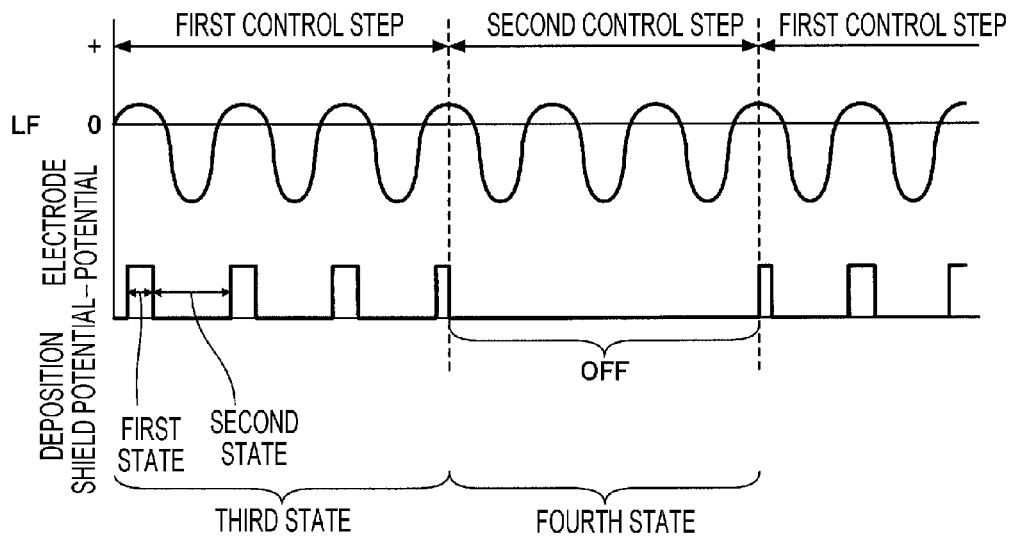
FIG. 14A is a timing chart illustrating a control method according to Modification 2-1 of an embodiment.

Modification 2-1 of FIG. 14A includes, in addition to the first control step, a second control step in which the DC voltage is intermittently stopped in a cycle independent of the cycle of the periodically varying parameter, which is exemplified by the LF voltage. The first control step and the second control step are repeatedly performed.

In Modification 2-1, the LF voltage is applied in the same cycle in the first control step and the second control step. Meanwhile, the DC voltage alternately repeats the first state and the second state at least once in the first control step, and intermittently stops in the second control step between the first control steps.

In the first control step and the second control step, the frequency of the LF may be, for example, 0.1 Hz to 100 kHz. In Modification 2-1 of FIG. 14A to Modification 2-4 of FIG. 14D, a DC voltage is applied during a partial period in which the periodically varying parameter, for example, the electrode potential, has a positive value such that that the potential of the deposition shield 11 is in the first state, and the second state is applied continuously with the first state. The DC voltage is a positive value, and the first voltage value in the first state is higher than the second voltage value in the second state.

Figure 14B:
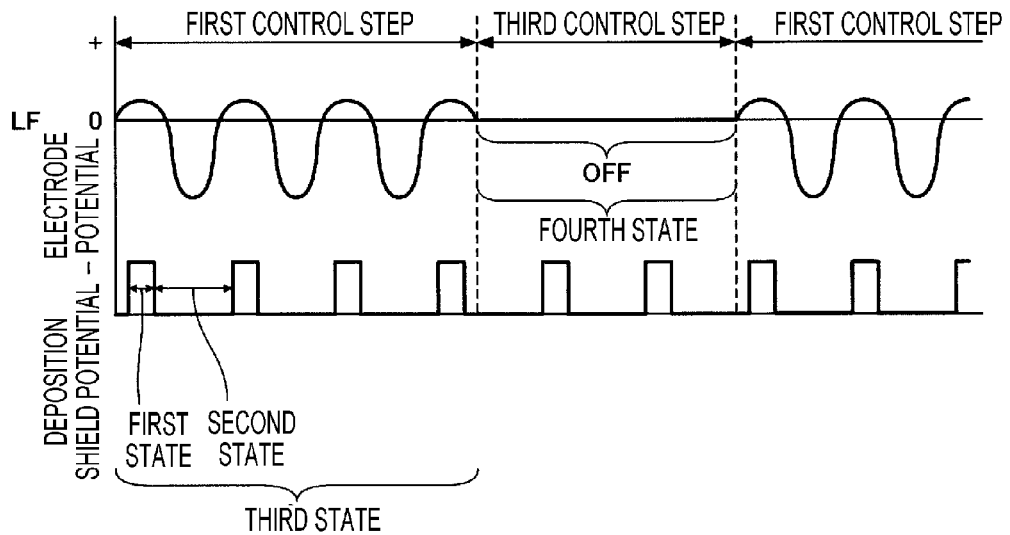
FIG. 14B is a timing chart illustrating a control method according to Modification 2-2 of an embodiment.
Figure 14C:
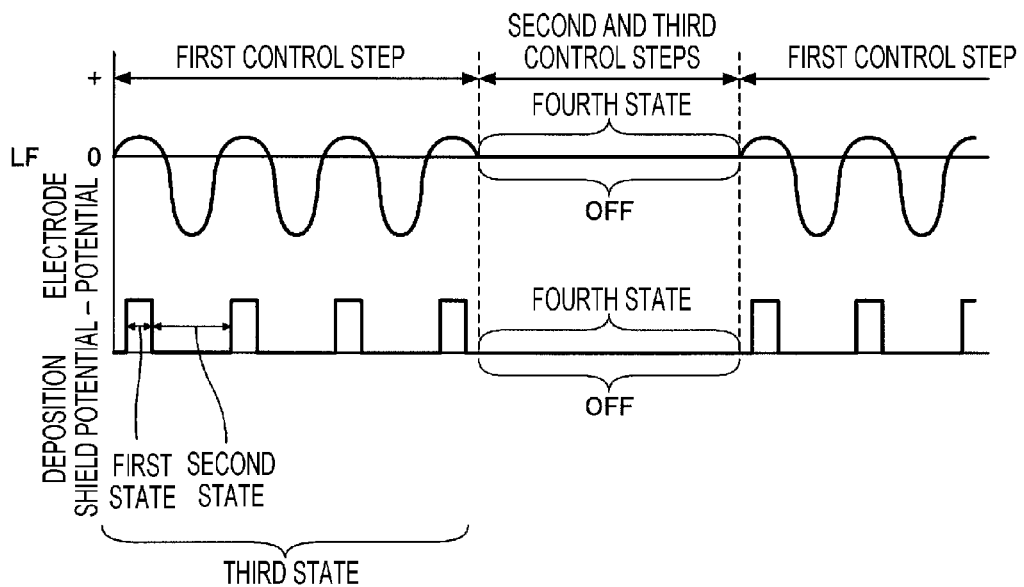
FIG. 14C is a timing chart illustrating a control method according to Modification 2-3 of an embodiment.
Figure 14D:
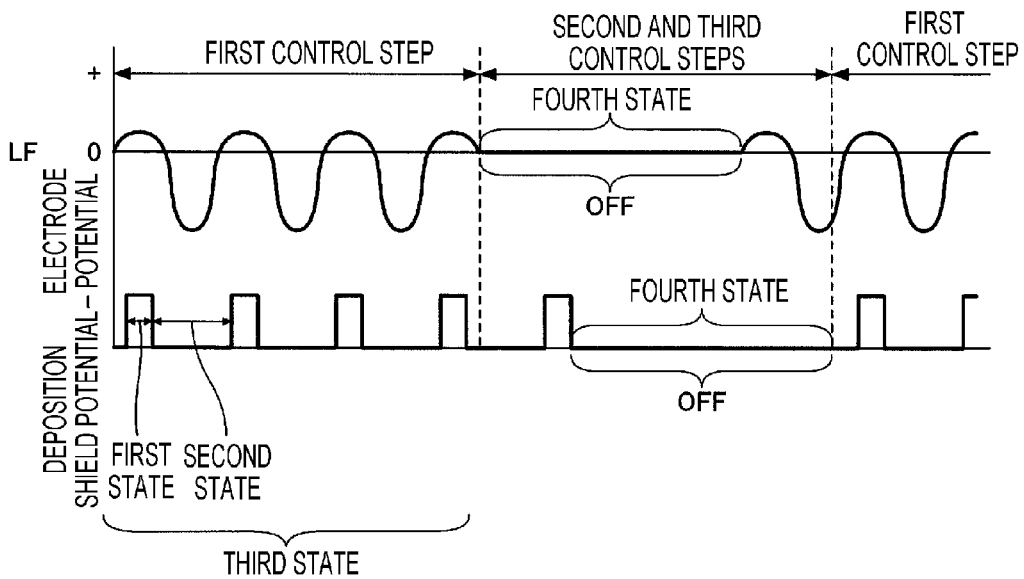
FIG. 14D is a timing chart illustrating a control method according to Modification 2-4 of an embodiment.

In Modification 2-1 of FIG. 14A to Modification 2-4 of FIG. 14D, the DC voltage has a positive voltage value in the first state, and the voltage value of the DC voltage is zero in the second state. A duty ratio of the DC voltage (=the fourth state/(the third state+the fourth state)) may be in a range of 1% to 99%.

A predetermined radio-frequency voltage (hereinafter, also referred to as "RF voltage") may be supplied to the deposition shield 11 of the processing container. In this case, the RF voltage may be supplied from the second radio-frequency power supply 90 to the deposition shield 11 of the processing container, or an RF power supply for applying the RF voltage to the stage 16 may be separately provided. The RF voltage has a first voltage value in the first state higher than a second voltage value in the second state.

In Modification 2-1 of FIG. 14A, the third state is exemplified by an example in which the DC voltage synchronized with the LF voltage in the first control step at a positive timing takes the first state, which is repeated with the second state of zero.

The control method according to Modification 2-2 of FIG. 14B includes, in addition to the first control step as in Modification 2-1, a third control step in which the bias power is intermittently stopped in a cycle independent of the cycle of the DC voltage. The state of the bias power in the third control step is an example of the fourth state.

In Modification 2-1, the first control step and the third control step are repeatedly performed. In Modification 2-1, the DC voltage in the third control step repeats the first state and the second state in the same cycle as in the first control step.

In the first control step, the frequency of the LF may be, for example, 0.1 Hz to 100 Hz, and the duty ratio of the voltage of the LF (=the fourth state/(the third state+the fourth state)) is in a range of 1% to 90%.

In the control method according to Modification 2-3 of FIG. 14C, the DC control in the second control step of Modification 2-1 and the LF control in the third control step of Modification 2-2 are performed in addition to the first control step as in Modification 2-1. That is, in Modification 2-3, the state where both of the DC voltage and the bias power are intermittently stopped is an example of the fourth state.

The cycle of intermittently stopping the bias power may be synchronized with the cycle of intermittently stopping the DC voltage. In this case, the cycle of intermittently stopping the DC and the bias power may be the same as illustrated in FIG. 14C. Alternatively, as illustrated in FIG. 4D, the cycle may be set such that the DC is shifted backward or forward from the bias power.

In FIGS. 14A to 14D, in the third state, the DC voltage is turned on at a part of the timing when the bias power is positive. However, the present disclosure is not limited to this. In addition, instead of periodically turning on/off the DC voltage, a control may be performed such that the DC voltage has a positive value and the absolute value periodically becomes High/Low.

[Modification 3]

Figure 15:
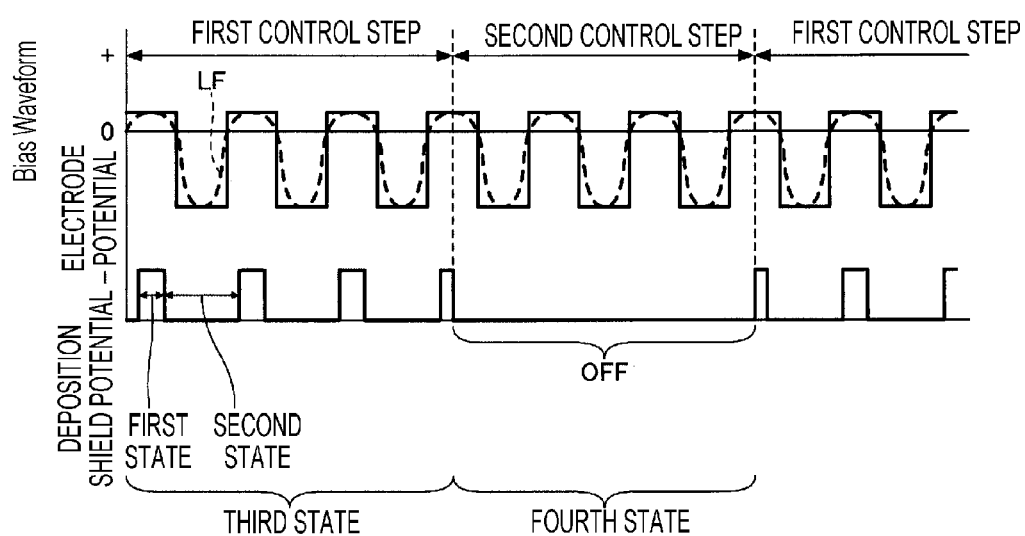
FIG. 15 is a timing chart illustrating a control method according to Modification 3 of an embodiment.

Next, a method for controlling a plasma processing apparatus 1 according to Modification 3 of an embodiment will be described. FIG. 15 is a timing chart illustrating a control method according to Modification 3 of an embodiment.

For example, in the control method according to Modification 3, a DC pulse is applied to the stage 16 as illustrated in FIG. 15. The positive value of the DC pulse corresponds to the positive peak of the LF voltage, and the negative value of the DC pulse corresponds to the negative peak of the LF voltage.

In this case, in the control method according to Modification 3, the positive DC voltage or the radio-frequency voltage periodically repeats the first state and the second state, and the first state is applied to a partial period within each cycle of the DC pulse and the second state is applied continuously with the first state. This may also prevent the occurrence of the elliptical shape or tilting of the hole at the edge of the wafer W.

For example, the DC voltage is controlled to the first voltage value in the first state in a part or all of the time when the DC pulse is zero or positive, and the second voltage value in the second state is controlled to be lower than the first voltage value in the first state in a part or all of the time when the DC pulse is negative. Thus, since the DC pulse is binarized, and the DC voltage is binarized and controlled in accordance with the binarization, the control is facilitated.

[Modifications 4-1 and 4-2]

Figure 16A:
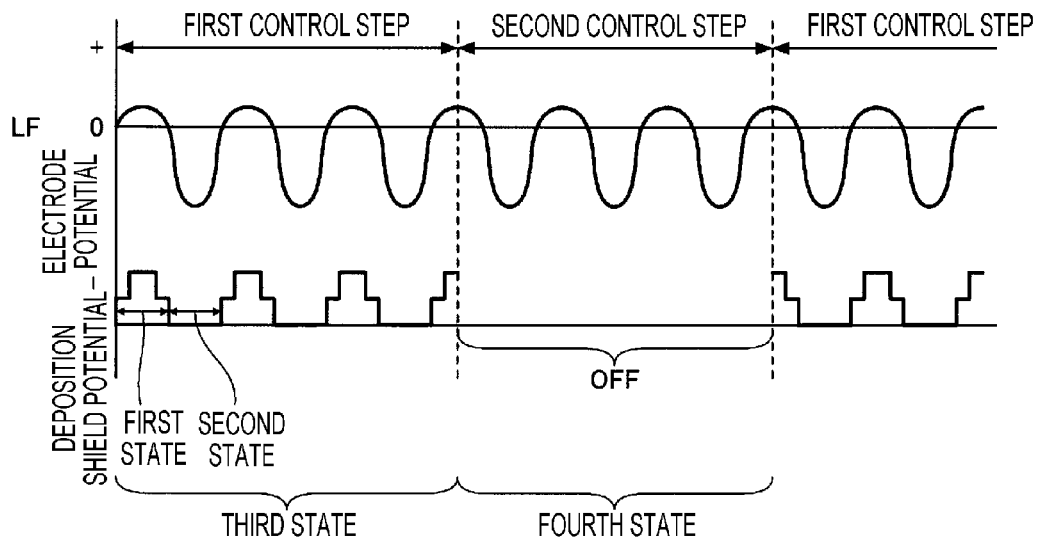
FIG. 16A is a timing chart illustrating a control method according to Modification 4-1 of an embodiment.
Figure 16B:
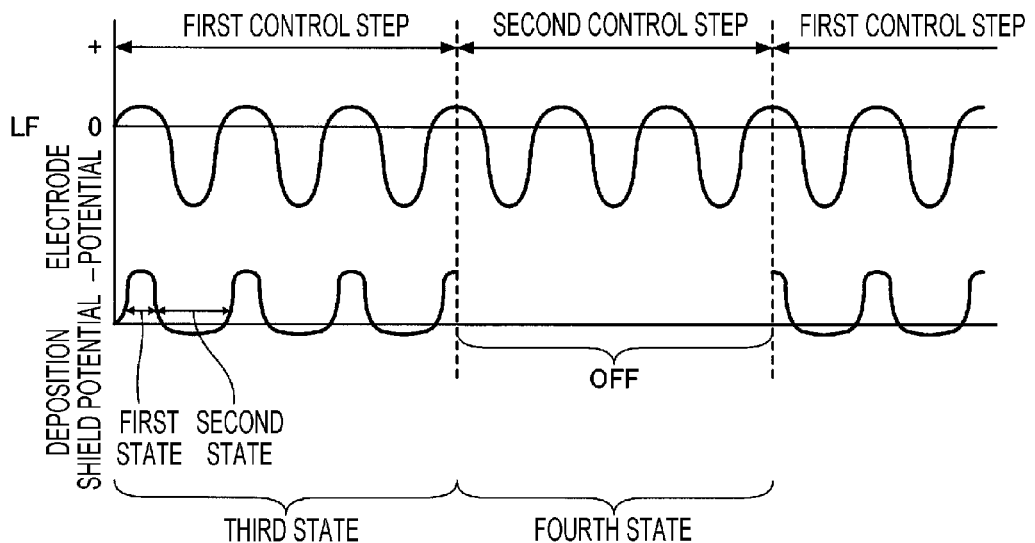
FIG. 16B is a timing chart illustrating a control method according to Modification 4-2 of an embodiment.

FIG. 16A is a timing chart illustrating a control method according to Modification 4-1 of an embodiment. FIG. 16B is a timing chart illustrating a control method according to Modification 4-2 of an embodiment. For example, in the control method according to Modifications 4-1 and 4-2 illustrated in FIGS. 16A and 16B, respectively, a radio-frequency voltage is applied during a partial period in which the periodically varying parameter, for example, the electrode potential, has a positive value such that that the potential of the deposition shield 11 is in the first state, and the second state is applied continuously with the first state. In Modification 4-1 illustrated in FIG. 16A, the first state of the DC voltage is positive, and has two or more first voltage values stepwise. Even in this case, the positive voltage is set such that the first voltage value in the first state is higher than the second voltage value in the second state.

When the radio-frequency voltage is applied, the first voltage value in the first state is higher than the absolute value of the second voltage value in the second state. The radio-frequency voltage may be supplied from the second radio-frequency power supply 90 to the deposition shield 11 of the processing container, or an RF power supply for applying the radio-frequency voltage may be separately provided.

In Modification 4-2 illustrated in FIG. 16B, the first state of the radio-frequency voltage smoothly has two or more first voltage values. In any case of FIGS. 16A and 16B, the first state and the second state are periodically repeated.

For example, in Modification 4-1 illustrated in FIG. 16A, the first state of the DC voltage is positive, and has two or more first voltage values stepwise. Even in this case, the first voltage value in the first state is higher than the second voltage value in the second state.

[Others]

The control of the controller 200 will be additionally described.

(Appendix 1) The controller 200 may supply source power during the period of the first state.

(Appendix 2) The period of the first state may include a timing at which the lower electrode or the upper electrode has a positive peak.

(Appendix 3) The controller 200 may supply at least one of source power and DC voltage at a time when the electrode potential is positive.

(Appendix 4) The controller 200 may supply at least one of source power and DC voltage at a time shifted from the timing at which the electrode potential is positive by a predetermined time.

(Appendix 5) The controller 200 may supply at least one of source power and DC voltage during a time when a margin of a predetermined time is added from a timing at which the electrode potential is positive.

The plasma processing apparatus according to the present disclosure may be applied to any of a capacitively coupled plasma (CCP) type, an inductively coupled plasma (ICP) type, a radial line slot antenna (RLSA) type, an electron cyclotron resonance plasma (ECR) type, and helicon wave plasma (HWP) type.

The step of supplying source power having a frequency higher than the bias power to the plasma processing space may be executed by supplying, by a plasma generation source for generating plasma, source power of, for example, a microwave source or a radio-frequency power supply, to a plasma processing space.

In this specification, a semiconductor wafer W has been described as an example of the object to be processed. However, the object to be processed is not limited thereto, and may be, for example, various substrates used in a liquid crystal display (LCD) or a flat panel display (FPD), a CD substrate, or a printed board.

According to an aspect, it is possible to control the collision energy of ions.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container;
an electrode configured to place a substrate thereon in the processing container;
a plasma generation source configured to supply plasma into the processing container;
a bias power supply configured to supply a bias power of a desired waveform to the electrode;
a part exposed to the plasma in the processing container;
a power supply configured to supply a voltage of a desired waveform to the part; and
a controller configured to execute a process including a first control procedure in which a first state where the voltage has a first voltage value and a second state where the voltage has a second voltage value higher than the first voltage value are periodically repeated, and the first voltage value is applied in a partial period in each cycle of a potential of the electrode, and the second voltage value is applied such that the first state and the second state are continuous.

2. The plasma processing apparatus according to claim 1, wherein the potential of the electrode is determined by a periodically varying parameter as measured in a transmission path of the bias power, or a signal synchronized with a cycle of the radio-frequency or a pulse wave of the bias power, and the periodically varying parameter includes at least one of a voltage, a current, an electromagnetic field, a change in light emission of generated plasma, and a change in sheath thickness of the plasma on a target object.

3. The plasma processing apparatus according to claim 1, wherein the power supply is a direct current (DC) power supply.

4. The plasma processing apparatus according to claim 1, wherein the partial period includes a timing at which the potential of the electrode becomes a positive peak.

5. The plasma processing apparatus according to claim 1, wherein the partial period includes a timing at which the potential of the electrode becomes a negative peak.

6. The plasma processing apparatus according to claim 1, wherein two or more voltage values are taken in the first state.

7. The plasma processing apparatus according to claim 1, wherein two or more voltage values are taken in the second state.

8. The plasma processing apparatus according to claim 1, wherein the second voltage value in the second state is zero.

9. The plasma processing apparatus according to claim 1, wherein the first control procedure of the process periodically repeats the first state, the second state, and two or more states where the voltage has two or more voltage values, applies the first voltage value in a partial period in each cycle of a potential of the electrode, and sequentially repeats the second voltage value and the two or more voltage values such that the first state, the second state, and the two or more states are continuous.

10. The plasma processing apparatus according to claim 1, wherein the process includes a second control procedure in which the voltage is intermittently stopped in a cycle independent of a cycle of the first control procedure.

11. The plasma processing apparatus according to claim 1, wherein the part is at least one of parts in the processing container including a ceiling wall, an insulator ring, a deposition shield, and a baffle plate, or dedicated parts disposed outside a processing space or gas space formed under an upper electrode facing the electrode or a space above an edge ring.

12. The plasma processing apparatus according to claim 1, wherein a pulsed DC power is applied to the electrode instead of the waveform of the bias power.

13. A plasma processing apparatus comprising:
a processing container;
an electrode configured to place a substrate thereon in the processing container;
a plasma generation source configured to supply plasma into the processing container;
a bias power supply configured to supply a bias power of a desired waveform to the electrode;
a part exposed to the plasma in the processing container;
a radio-frequency power supply configured to supply a radio-frequency voltage having a frequency equal to or higher than a frequency of the voltage of the bias power of the desired waveform; and
a controller configured to execute a process including a first control procedure in which the radio-frequency voltage is applied to the electrode so as to generate a predetermined phase difference with respect to a phase of the potential of the electrode.

14. The plasma processing apparatus according to claim 13, wherein the part is at least one of parts in the processing container including a ceiling wall, an insulator ring, and a baffle plate, or dedicated parts disposed outside a processing space or gas space formed under an upper electrode facing the electrode or a space above an edge ring.

15. The plasma processing apparatus according to claim 13, wherein a pulsed DC power is applied to the electrode instead of the waveform of the bias power.

16. A control method for a plasma processing apparatus including: a processing container; an electrode configured to place a substrate thereon in the processing container; a plasma generation source configured to supply plasma into the processing container; a bias power supply configured to supply a bias power of a desired waveform to the electrode; a part exposed to the plasma in the processing container; and a power supply configured to supply a voltage of a desired waveform to the part, the control method comprising:
periodically repeating a first state where the voltage has a first voltage value and a second state where the voltage has a second voltage value higher than the first voltage value; and
applying the first voltage value in a partial period in each cycle of a potential of the electrode, and applying the second voltage value such that the first state and the second state are continuous.

17. The control method according to claim 16, further comprising: generating a synchronization signal synchronized with the potential of the electrode;
generating a control signal for the power supply output from the synchronization signal; and
transmitting the generated control signal to at least one of the power supply and a phase shift circuit, and
wherein the voltage is supplied to the part from at least one of the power supply and the phase shift circuit.

18. The control method according to claim 16, wherein the power supply is a DC power supply.

19. A control method for a plasma processing apparatus including: a processing container; an electrode configured to place a substrate thereon in the processing container; a plasma generation source configured to supply plasma into the processing container; a bias power supply configured to supply a bias power of a desired waveform to the electrode; a part exposed to the plasma in the processing container; and a power supply configured to supply a radio-frequency voltage having a frequency equal to a frequency of the voltage of the bias power of the desired waveform, the control method comprising:
applying the radio-frequency voltage to the electrode and generating a predetermined phase difference with respect to a phase of the potential of the electrode.

20. The control method according to claim 19, further comprising:
generating a control signal for a radio-frequency voltage output from the bias power supply;
transmitting the generated control signal to a phase shift circuit; and
supplying the radio-frequency voltage to the part from the phase shift circuit.

* * * * *